United States Patent
Leeb et al.

(10) Patent No.: US 12,107,421 B2
(45) Date of Patent: Oct. 1, 2024

(54) VOLTAGE WAVEFORM TRANSIENT IDENTIFICATION AND AUTONOMOUS LOAD COORDINATION

(71) Applicant: Massachusetts Institute of Technology, Cambridge, MA (US)

(72) Inventors: Steven B. Leeb, Belmont, MA (US); John K. Nowocin, Cambridge, MA (US); Peter Lindahl, Wellesley, MA (US); Spencer Shabshab, McLean, VA (US)

(73) Assignee: Massachusetts Institute of Technology, Cambridge, MA (US)

( * ) Notice: Subject to any disclaimer, the term of this patent is extended or adjusted under 35 U.S.C. 154(b) by 361 days.

(21) Appl. No.: 17/430,753

(22) PCT Filed: Feb. 14, 2020

(86) PCT No.: PCT/US2020/018300
§ 371 (c)(1),
(2) Date: Aug. 13, 2021

(87) PCT Pub. No.: WO2020/168198
PCT Pub. Date: Aug. 20, 2020

(65) Prior Publication Data
US 2022/0149624 A1   May 12, 2022

Related U.S. Application Data

(60) Provisional application No. 62/805,626, filed on Feb. 14, 2019, provisional application No. 62/895,240, filed on Sep. 3, 2019.

(51) Int. Cl.
*G01R 27/28* (2006.01)
*G01R 23/16* (2006.01)
(Continued)

(52) U.S. Cl.
CPC .............. *H02J 3/144* (2020.01); *G01R 23/16* (2013.01); *G05B 19/042* (2013.01);
(Continued)

(58) Field of Classification Search
CPC .......... H02J 3/00125; H02J 3/24; H02J 3/144; H02J 2310/10; G01R 23/16;
(Continued)

(56) References Cited

U.S. PATENT DOCUMENTS 4,672,555 A   6/1987   Hart
5,483,153 A   1/1996   Leeb
(Continued)

OTHER PUBLICATIONS

U.S. Appl. No. 17/430,752, filed Aug. 13, 2021, Leeb et al.
(Continued)

*Primary Examiner* — Thang X Le
(74) *Attorney, Agent, or Firm* — DALY, CROWLEY, MOFFORD & DURKEE, LLP

(57) ABSTRACT

Described are systems and techniques for extracting frequency and voltage harmonic transients corresponding to individual load events. Such systems and techniques can be used to make electrical loads aware of the operation of other loads in an electric grid. Thus, awareness is achieved using information derived only from a utility voltage waveform at a load. Also described are systems and techniques for incorporating such awareness into load controllers which allows loads to autonomously meet system level objectives in addition to their individual requirements.

28 Claims, 25 Drawing Sheets

(51) Int. Cl.

| | |
|---|---|
| G05B 19/042 | (2006.01) |
| H02J 3/00 | (2006.01) |
| H02J 3/14 | (2006.01) |
| H02J 3/24 | (2006.01) |

(52) U.S. Cl.
CPC ............ *H02J 3/00125* (2020.01); *H02J 3/24* (2013.01); *G05B 2219/2639* (2013.01); *H02J 2310/10* (2020.01)

(58) Field of Classification Search
CPC .......... G05B 19/042; G05B 2219/2639; Y04S 20/222; Y04S 20/00; Y02B 90/20; Y02B 70/3225
See application file for complete search history.

(56) References Cited

U.S. PATENT DOCUMENTS

| | | | |
|---|---|---|---|
| 5,535,087 A * | 7/1996 | Puckett | H02H 9/005 |
| | | | 333/175 |
| 10,075,016 B2 * | 9/2018 | Wilkins | H02J 3/01 |
| 2006/0187600 A1 * | 8/2006 | Brown | H02J 3/14 |
| | | | 361/71 |
| 2012/0278014 A1 | 11/2012 | Davies | |
| 2014/0078625 A1 | 3/2014 | Zheng | |
| 2016/0149410 A1 * | 5/2016 | Gilbert | H02J 13/00034 |
| | | | 700/295 |
| 2016/0179116 A1 | 6/2016 | Bacque et al. | |
| 2016/0233677 A1 * | 8/2016 | Douglass | H02J 3/14 |
| 2016/0239010 A1 | 8/2016 | McDaniel | |
| 2018/0152015 A1 | 5/2018 | Cheng | |
| 2018/0217658 A1 | 8/2018 | Bruhn | |
| 2018/0292436 A1 | 10/2018 | Ogorodnov et al. | |
| 2019/0012604 A1 | 1/2019 | Hiratsuka | |
| 2020/0011908 A1 | 1/2020 | Bickel | |
| 2021/0165024 A1 * | 6/2021 | Menzel | H02J 3/00 |
| 2022/0181877 A1 | 6/2022 | Leeb et al. | |

OTHER PUBLICATIONS

PCT International Preliminary Report dated Aug. 26, 2021 for International Application No. PCT/US2020/018294; 9 Pages.
PCT International Preliminary Report dated Aug. 26, 2021 for International Application No. PCT/US2020/018300; 8 Pages.
Spencer C. Shabshab, Fuel-Conserving Environmental Control Strategies for Small, Islanded Microgrids, Massachusetts Institute of Technology Library, Jun. 25, 2018, 97 pages.
Spencer C. Shabshab, et al., Voltage Waveform Transient Identification for Autonomous Load Coordination, IEEE Access, Sep. 12, 2019, 10 pages.
PCT Notification of Transmittal of the International Search Report and the Written Opinion of the International Searching Authority, or the Declaration, PCT/US2020/018300, dated Jul. 22, 2020, 1 page.
PCT International Search Report, PCT/US2020/018300, dated Jul. 22, 2020, 3 pages.
PCT Written Opinion of the International Searching Authority, PCT/US2020/018300, dated Jul. 22, 2020, 6 pages.
PCT Notification of Transmittal of the International Search Report and the Written Opinion of the International Searching Authority, or the Declaration, PCT/US2020/018294, dated Jul. 22, 2020, 1 page.
PCT International Search Report, PCT/US2020/018294, dated Jul. 22, 2020, 2 pages.
PCT Written Opinion of the International Searching Authority, PCT/US2020/018294, dated Jul. 22, 2020, 7 pages.
Office Action dated Feb. 9, 2024, for U.S. Appl. No. 17/430,752; 53 pages.
Ahmadi et al.; "Optimizing Load Control in a Collaborative Residential Microgrid Environment"; IEEE Transactions on Smart Grid; vol. 6, No. 3; May 2015; 12 Pages.
Althaher et al.; "Automated demand response from energy management system under dynamic pricing and power and comfort constraints"; IEEE Transactions on Smart Grid; vol. 6, No. 4; Jul. 2015; 10 Pages.
Andriulli et al.; "Advanced Power Generation Systems for the 21$^{st}$ Century: Market Survey and Recommendations for a Design Philosophy"; Oad Ridge National Laboratory; 1999; Part 1; 118 Pages.
Andriulli et al.; "Advanced Power Generation Systems for the 21$^{st}$ Century: Market Survey and Recommendations for a Design Philosophy"; Oad Ridge National Laboratory; 1999; Part 2; 119 Pages.
Avci et al.; "Model Predictive hvac load control in building using real-time electricity pricing"; Energy and Buildings; vol. 60; 2013; 11 Pages.
Bhandari et al.; "Reducing fuel consumption in microgrids using pv, batteries, and generator cycling"; IEEE International Conference on Electro-Information Technology; May 9, 2013; 4 Pages.
Boait et al.; "Estimation of demand diversity and daily demand profile for off-grid electrification in developing countries"; Energy for Sustainable Development; vol. 29; 2015; 7 Pages.
Bredariol et al.; "Shipboard Automatic Watchstander"; 8 Pages.
Chen et al.; "Sizing of energy storage for microgrids"; IEEE Transactions on Smart Grid; vol. 3, No. 1; Mar. 2012; 10 Pages.
Cintuglu et al.; "Development and application of a real-time testbed for multiagent system interoperability: A case study on hierarchical microgrid control"; IEEE Transactions on Smart Grid; IEEE Xplore Digital Library; Aug. 2016; 10 Pages.
Colson et al.; "Comprehensive real-time microgrid power management and control with distributed agents"; IEEE Transactions on Smart Grid; vol. 4, No. 1; Mar. 2013; 11 Pages.
Cox et al.; "Transient even detection for nonintrusive load monitoring and demand side management using voltage distortion"; Twenty-First Annual IEEE Applied Power Electronics Conference and Exposition; Mar. 19, 2006; 7 Pages.
Ding et al.; "Autonomous control of active power electronics loads for frequency control of islanded microgrid"; 2017 IEEE Energy Conversion Congress and Exposition (ECCE); Oct. 2017; 6 Pages.
Dong et al.; "Non-intrusive signature extraction for major residential loads"; IEEE Transactions on Smart Grid; vol. 4, No. 3; Sep. 2013; 10 Pages.
Donnal et al.; "Energy Applications for an energy box"; IEEE Internet of Things Journal; vol. 3, No. 5; Oct. 2016; 9 Pages.
Dou et al.; "Multi-agent based hierarchical hybrid control for smart microgrid"; IEEE Transactions on Smart Grid; vol. 4, No. 2; Jun. 2013; 8 Pages.
Douglass; "Integrating autonomous load controllers in power systems"; Master's Thesis; Technical University of Denmark, Department of Engineering; 2014; Part 1; 85 Pages.
Douglass; "Integrating autonomous load controllers in power systems"; Master's Thesis; Technical University of Denmark, Department of Engineering; 2014; Part 2; 85 Pages.
Eady et al.; "Sustain the Mission Project: Casualty factors for fuel and water resupply convoys—final Technical Report"; Army Environmental Policy Institute; Sep. 2009; 22 Pages.
Eksin et al.; "Demand response management in smart grids with heterogenous consumer preferences"; IEEE Transactions on Smart Grid; vol. 6, No. 6; Nov. 2015; 13 Pages.
Gillman et al.; "Accounting for every kilowatt"; Defense AT&L; Sep.-Oct. 2014; 7 Pages.
Green et al.; "A Multi-scale framework for nonintrusive load identification"; IEEE Transactions on Industrial Informatics; vol. 16, No. 2; Feb. 2020; 11 Pages.
ElectronicsHub, Harmonic Frequencies, By Administrator, Jun. 22, 2015; http://www.electronicshub.org/harmonic-frequencies/; 16 Pages.
Ha et al.; "Control of energy in home automation by resource constraint scheduling"; The 15$^{th}$ International Conference on Control System and Computer Science; May 25, 2005; 7 Pages.
Han et al.; "Constrained optimum generator dispatch for fuel consumption minimization"; IEEE Power & Energy Society General Meeting; Jul. 21, 2013; 5 Pages.
He et al.; "Incorporating Non-Intrusive Load Monitoring Into Building Level Demand Response"; IEEE Transactions on Smart Grid; vol. 4, No. 4; Dec. 2013; 8 Pages.

(56) References Cited

OTHER PUBLICATIONS

Homer Pro; "How HOMER Creates the Generator Efficiency Curve"; Printed Dec. 1, 2023; https://www.homerenergy.com/products/pro/docs/3.12/ hm print window.htm?how homer creates the generator efficiency curve.html; 4 Pages.
Hu et al.; "Planning of microgrid considering power quality constraints"; 17th International Conference on Harmonics and Quality of Power; Oct. 16, 2016; 6 Pages.
Huang et al.; "Accurate power quality monitoring in microgrids"; 2016 15th ACM/IEEE International Conference on Information Processing in Sensor Networks (IPSN); Apr. 2016; 6 Pages.
Kelly et al.; "Neural nilm: Deep neural networks applied to energy disaggregation"; arXiv:1507:06594v3; Sep. 28, 2015; 10 Pages.
Kelly et al.; "Reducing fuel consumption in a forward operating base using an energy management system"; 2013 IEEE Energy Conversion Congress and Exposition; Sep. 15, 2013; 7 Pages.
Lajoie et al.; "Residential water heaters as a grid-scale energy storage solution using model predictive control"; 2013 1st IEEE Conference on Technologies for Sustainability (SusTech); Aug. 1, 2013; 8 Pages.
Larsson, "High Frequency Distortion in Power Grids due to Electronic Equipment"; Lulea University of Tech.; http://diva-portal.org/smash/get/diva2:999265/FULLTEXT01.pdf; 165 Pages.
Laughman et al.; "Power signature analysis"; IEEE Power & Energy Magazine; Mar./Apr. 2003; 8 Pages.
Lindahl et al. "Shipboard fault detection through nonintrusive load monitoring: A case study"; IEEE Sensors Journal; vol. 18, No. 21; Nov. 1, 2018; 10 Pages.
Liu et al.; "Energy-sharing model with price-based demand response for microgrids of peer-to-peer prosumers"; IEEE Transactions on Power Systems; vol. 32, No. 5; Sep. 2017; 15 Pages.
Lopes et al.; "Defining control strategies for microgrids islanded operation"; IEEE Transactions on Power Systems; vol. 21, No. 2; May 2006; 9 Pages.
Lu et al. "An empirical study of communication infrastructures towards the smart grid: Design, implementation, and evaluation"; IEEE Transactions on Smart Grid; vol. 4, No. 1; Mar. 2013; 14 Pages.
Lu; "An evaluation of the hvac load potential for providing load balancing service"; IEEE Transactions on Smart Grid; vol. 3, No. 3; Sep. 2012; 8 Pages.
Luo et al.; "Optimal dispatch of air conditioner loads in southern china region by direct load control"; IEEE Transactions on Smart Grid; vol. 7, No. 1; Jan. 2016; 12 Pages.
McCaskey; "Renewable energy systems for forward operating bases: A simulations-based optimization approach"; Master's Thesis; Colorado State University; Aug. 2010; 107 Pages.
Merino et al.; "Islanding detection in microgrids using harmonic signatures"; IEEE Transactions on Power Delivery; vol. 30, No. 5; Oct. 2015; 8 Pages.
Moran; "Microgrid load management and control strategies"; 2016 IEEE/PES Transmission and Distribution Conference and Exposition; May 3, 2016; 4 Pages.
Newell et al.; "Thermal mass design"; Solar NZEB Project; Ashrae Journal; Mar. 2011; 4 Pages.
Paris et al.; "Hunting cyclic energy wasters"; IEEE Transactions on Smart Grid; vol. 5, No. 6; Nov. 2014; 10 Pages.
Paris et al.; "The sinefit spectral envelope preprocessor"; IEEE Sensors Journal; vol. 14, No. 12; Dec. 2014; 10 Pages.
Pourmousavi et al. "Real-time demand response through aggregate electric water heaters for load shifting and balancing wind generation"; IEEE Transactions on Smart Grid; vol. 5, No. 2; Mar. 2014; 10 Pages.
Salvadori et al.; "Smart grid infrastructure using a hybrid network architecture"; IEEE Transactions on Smart Grid; vol. 4, No. 3; Sep. 2013; 10 Pages.
Shabshab et al.; "Microgrid modeling and fuel savings opportunities through centralized load control"; IECON 2018-44th Annual Conference of the IEEE Industrial Electronics Society; Oct. 21, 2018; 6 Pages.
Shabshab et al.; "Demand Smoothing in Military Microgrids Through Coordinated Direct Load Control"; IEEE Transactions on Smart Grid; vol. 11, No. 3; May 2020; 11 Pages.
Shanming et al.; "Research on voltage harmonic distortion of synchronous generators"; ICEMS'2001 Proceedings of the Fifth International Conference on Electrical Machines and Systems; vol. 1; Aug. 2001; 4 Pages.
Shaw; "A power quality prediction system"; IEEE Transactions on Industrial Electronics; vol. 47, No. 3; Jun. 2000; 7 Pages.
Shaw et al.; "Nonintrusive Load Monitoring and Diagnostics in Power Systems"; IEEE Transactions on Instrumentation and Measurement; vol. 57, No. 7; Jul. 2008; 10 Pages.
Son et al.; "Operation scheduling considering demand response in a commercial building with chiller system and energy storage system"; 2015 IEEE PES Asia-Pacific Power and Energy Engineering Conference (APPEEC); Nov. 15, 2015; 5 Pages.
Sprague; "Optimal scheduling of time-shiftable electric loads in expeditionary power grids"; Master's Thesis; Naval Postgraduate School; Sep. 2015; 121 Pages.
Turner et al.; "Peak load reductions: Electric load shifting with mechanical pre-cooling of residential buildings with low thermal mass"; Energy; vol. 82; Mar. 2015; 11 Pages.
Verrilli et al.; "Demand side management for heating controls in microgrids"; IFAC-PapersOnLine; vol. 49, No. 1; Jan. 1, 2016.
Williams et al. "Use of a computer-based system to measure and manage energy consumption in the home"; Proceedings of the 2006 IEEE International Symposium on Electronics and the Environment; May 8, 2006; 6 Pages.
Xiao et al.; "Sizing of energy storage and diesel generators in an isolated microgrid using discrete fourier transform"; IEEE Transactions on Sustainable Energy; vol. 5, No. 3; Jul. 2014; 10 Pages.
Zachar; "Naval applications of enhanced temperature, vibration and power monitoring"; Master's Thesis; Massachusetts Institute of Technology; Jun. 2015; 133 Pages.
Zhang et al.; "Parameter selection for a centralized thermostatically controlled appliances load controller used for intra-hour load balancing"; IEEE Transactions on Smart Grid; vol. 4, No. 4; Dec. 2013; 9 Pages.
"Model F100-60K ECU Environmental Control Unit—Part No. 2003841—Operations and Maintenance Manual"; HDT Engineered Technologies; 32 Pages.
"Copeland Digital Compressor Controller"; Application Engineering Bulletin; Emerson Climate Technologies; Mar. 2011; 12 Pages.
"Sustainable Forward Operating Bases"; Strategic Environmental Research and Development Program (SERDP); May 21, 2010, 91 Pages.
Applicant-Initiated Interview Summary dated Nov. 17, 2023 for U.S. Appl. No. 17/430,752; 3 Pages.
Office Action dated Sep. 15, 2023 for U.S. Appl. No. 17/430,752; 38 Pages.
Notice of Non-Compliant Amendment dated May 24, 2023 for U.S. Appl. No. 17/430,752; 2 Pages.
Response to Non-Compliant Amendment dated May 24, 2023 for U.S. Appl. No. 17/430,752, filed Jun. 5, 2023; 22 Pages.
Office Action dated Feb. 17, 2023 for U.S. Appl. No. 17/430,752; 40 Pages.
Response to Office Action dated Feb. 17, 2023 for U.S. Appl. No. 17/430,752, filed May 11, 2023; 22 Pages.
Applicant-Initiated Interview Summary dated May 1, 2023 for U.S. Appl. No. 17/430,752; 3 Pages.
Preliminary Amendment dated Aug. 13, 2021 for U.S. Appl. No. 17/430,752; 3 Pages.
Response to Office Action dated Sep. 15, 2023 for U.S. Appl. No. 17/430,752, filed Dec. 14, 2023; 19 Pages.

* cited by examiner

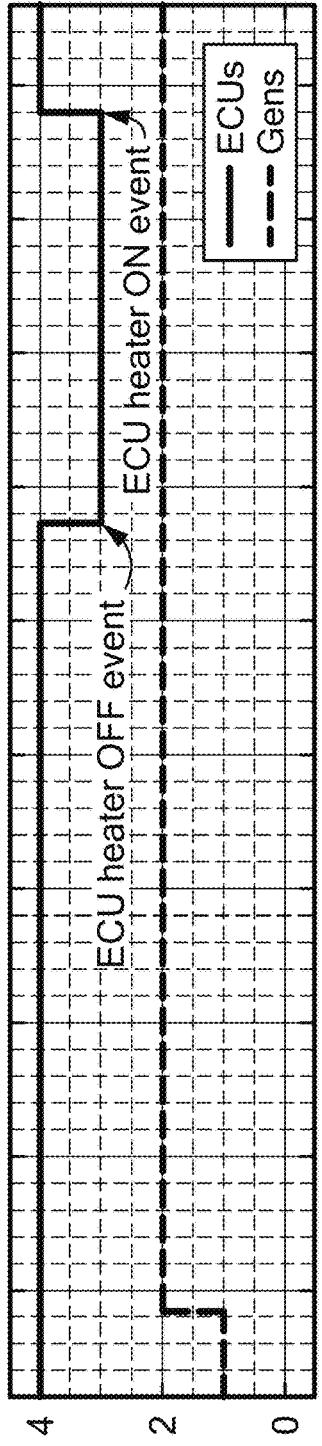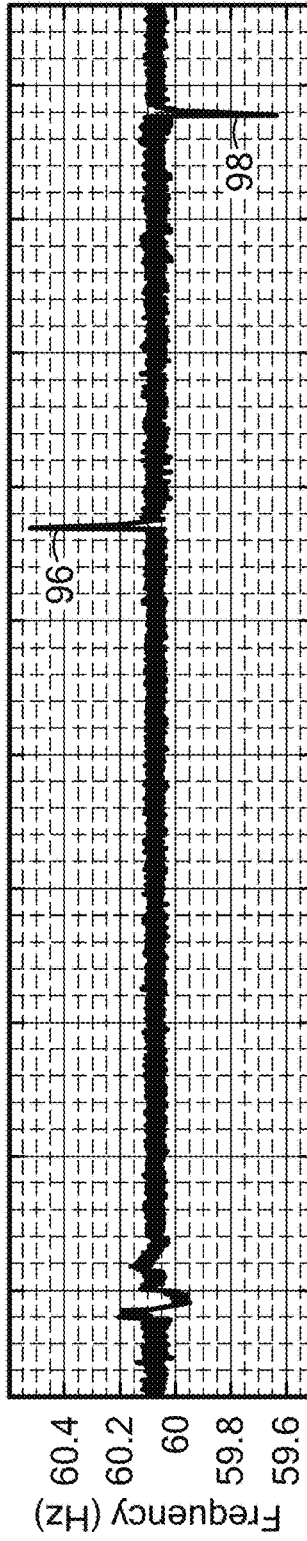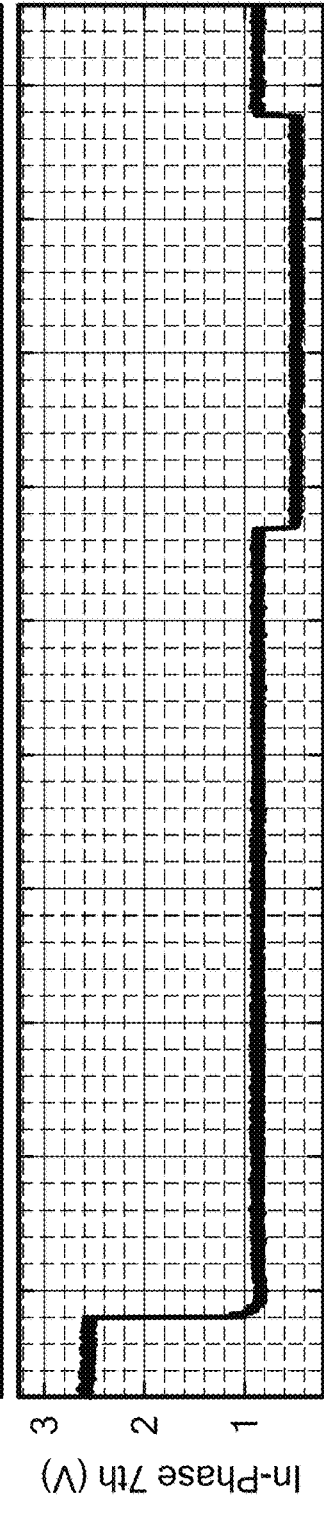
FIG. 20
FIG. 20A
FIG. 20B

VOLTAGE WAVEFORM TRANSIENT IDENTIFICATION AND AUTONOMOUS LOAD COORDINATION

CROSS REFERENCE TO RELATED APPLICATIONS

This application is a U.S. National Stage of PCT application PCT/US2020/018300 filed in the English language on Feb. 14, 2020 and entitled "VOLTAGE WAVEFORM TRANSIENT IDENTIFICATION AND AUTONOMOUS LOAD COORDINATION," which claims the benefit under 35 U.S.C. § 119 of provisional application No. 62/805,626 filed Feb. 14, 2019, and also claims benefit under 35 U.S.C. § 119 of provisional application No. 62/895,240 filed Sep. 3, 2019, which applications are hereby incorporated herein by reference.

GOVERNMENT RIGHTS

Co-inventor Spencer C. Shabshab contributed to this invention on government time while he was an employee of the Department of the Navy. The Government of the United States of America has certain rights in the invention.

BACKGROUND

As is known in the art, electric loads typically operate with uncoordinated schedules. This may result in an electrical grid to which the loads are coupled becoming unstable and/or unreliable and in particular may result in unstable/unreliable power from a portion of a grid or from a microgrid. To track power quality, determine when emergency load shedding is required to maintain grid (and/or microgrid) stability, and to detect so-called microgrid islanding events, measurements of grid voltage have been used. Most nonintrusive monitors, and power meters in general, measure both current and voltage. Power quality disturbances have also been used to identify loads on a power system.

As is also known, large power consuming loads are targets for energy-saving demand response schemes. Loads amenable to demand response scheduling include deferrable loads, thermal loads that can be curtailed within acceptable temperature bounds, and curtailable loads, which can be completely switched off until needed. Conventional demand response schemes often require centralized optimization based upon aggregated inputs and knowledge of load type to produce distributed tasking orders or load scheduling across energy consumers.

SUMMARY

This Summary is provided to introduce a selection of concepts in simplified form that are further described below in the Detailed Description. This Summary is not intended to identify key or essential features or combinations of the claimed subject matter, nor is it intended to be used to limit the scope of the claimed subject matter.

In general, described herein are systems and techniques for extracting frequency and voltage harmonic transients corresponding to individual load events. Such systems and techniques can be used to make electrical loads "aware" of the operation of other loads in an electric grid. As used in this context, the term "aware" is understood to mean that one electrical load is informed or otherwise alerted to some information about the other loads (e.g. whether another electrical load is starting, stopping or operating. Awareness is achieved in one embodiment using information derived only from a utility voltage waveform at a load. For example. information extracted from frequency and voltage harmonic transients. However, "awareness" could also be achieved by intentional signaling means, including the use of networking, power line carrier transmissions, wireless signals, optical signals, acoustic signals, or other signaling means as would be known to a person of ordinary skill in the art.

Also described are systems and techniques for incorporating such awareness into load controllers which allows loads to autonomously meet system level objectives in addition to their individual requirements.

In one aspect, unlike prior art systems and methods for analysis of voltage measurements local to a load, described herein are transient identification techniques which take into account frequency variations in a voltage waveform as well as harmonics to identify a transient. In embodiments, the systems and techniques described herein make explicit use of transient exemplars in a frequency waveform.

In one aspect, described are systems and techniques for creating "self-driving" loads that are aware of the operation of other local loads. Particularly on a microgrid, important energy consumers (i.e. electric loads which consume a relatively large amount of energy compared with other loads couple to the same grid) can detect the operation of neighboring loads without special information or control wiring. Analogous to the way a good driver is aware of neighboring cars, described herein are "autonomous demand response" schemes that permit loads to naturally optimize the overall energy consumption of an aggregate group of loads on a grid. The techniques described herein may be utilized in microgrids and can also be applied on subsections of a conventional utility or other power system.

In accordance with one aspect of the concepts described herein, it has been recognized that examination of frequency variation and harmonics may result in effective transient identification in practical applications.

It is noted that in prior art techniques, this information (i.e. information related to frequency variation and harmonics) was effectively not considered or at least not explicitly considered.

In one aspect, described are techniques for identifying load operation "signatures" strictly from measurements of utility voltage. These techniques are particularly applicable in low-inertia microgrids or "street-level" distribution networks where a utility may not be "stiff" due to generator limitations or impedance from a local distribution transformer. Among other uses, this information could be used for autonomous control of cyclically operating loads.

In embodiments, multiple transient exemplars are introduced for a load, to account for different grid configurations that lead to different transient shapes (i.e. different signatures) for the same load.

In accordance with a further aspect of the concepts described herein, systems and techniques are described for autonomously identifying load operating information (e.g. neighboring load operating information) using voltage values local to a load. In embodiments, local voltage measurements are made and analyzed to determine load operating information. In embodiments, analyzing voltage values local to a load may be used to determine load operating information of neighboring loads.

In embodiments, the system includes a nonintrusive system and technique to detect power events and identify them strictly from changes in a voltage waveform of the utility. Voltage-only load identification means that any load on a local utility network can, in principle, identify the operating schedule of loads in the network neighborhood. With this approach, the utility itself effectively doubles as a load-monitoring information exchange network. The described system and technique can be augmented or enhanced, where appropriate, with other signals, including power line carrier signals, to confirm or ensure the detection of load operation. This information could be used by "aware" loads to self-schedule their operation to avoid power demand peaks.

In accordance with a further aspect of the concepts described herein, an autonomous load comprises: a detection circuit configured to measure, sense or otherwise detect a characteristic of a signal provided to the autonomous load, an event identification processor for extracting and identifying a load event based upon signal measured, sensed or otherwise detected by the detection circuit; and an autonomous load controller configured to receive load event information from the event identification processor and for providing a control signal to the autonomous load in response to the load event information.

With this particular arrangement, an autonomous load capable of changing its operating state in response to load event information is provided. For example, in response to receiving load event information which indicates that another load coupled to the same electrical grid as the autonomous load has changed its state (e.g. the other load has turned on, turned, off, slowed down, sped up, is drawing more or less power from a grid, etc. . . . ) the autonomous load can change its state accordingly. For example, in response to an autonomous load receiving load event information which indicates that another load has changed its state from off to on, the autonomous load may change its state from on to off. In this example, the autonomous load may change its state to off to prevent drawing more power than can be sourced by the electrical grid to which both loads are coupled.

In embodiments, the detection circuit is configured to measure, detect or otherwise sense, a characteristic of one or more signals provided to the autonomous load. In embodiments, the detection circuit is configured to measure, detect or otherwise sense one or more of: a power signal, a voltage signal or a current signal. In embodiments, the one or more signals measured, detected or otherwise sensed by the detection circuit may be one or more an analog signals, one or more digital signals or a combination of one or more analog and digital signals. In embodiments, the detection circuit may be configured to measure, detect or otherwise sense signal characteristics including but not limited to: signal transients (including characteristics of amplitude and frequency transients); changes in signal transients; signal frequencies and/or amplitudes; changes in signal frequencies and/or amplitudes, signal waveforms; changes in signal waveforms; power levels (e.g. minimum, average and/or peak power levels); and/or changes in power levels.

In embodiments, the event identification processor comprises a transient identification processor configured to extract information from transient characteristics of the signal measured or otherwise obtained by the detection circuit.

In embodiments, the autonomous load may further comprise communication means for signaling or otherwise communicating with other autonomous loads or other systems such as other control systems. In embodiments, such communication means may be implemented as power line carrier communication system, a wire-based communication system (e.g. telephone networks, or ethernet networks, and fiber-optic networks, waveguide transmission lines), or wireless communication system (e.g. a cellular transceiver or other type of transceiver for performing packet-based communication). Other forms of signaling may also be used.

In embodiments the autonomous load may include any one or all of the following features single or in combination including, but not limited to: the detection circuit or autonomous load controller monitors an environment of the load; the autonomous load controller updates knowledge of a grid state and/or a load state; the autonomous load controller causes a load to change states; the autonomous load controller receives information on an operational state of a load and on external factors of the load and processes the operational state and external factor information in determining whether to cause a load to change states; an event identification routine is triggered when an event is detected in either or both of a frequency or a harmonic data streams; wherein in response to the event identification processor identifying an event as a power source on/off event or a load on/off event, the event identification processor updates the autonomous load controller's knowledge of the grid state; wherein in response to the event identification processor not recognizing an event, the autonomous load (e.g. via the event identification processor or another processor) declares an event collision; wherein the event identification processor is configured to identify a $7^{th}$ frequency harmonic characteristic.

In accordance with a further aspect of the concepts described herein, an autonomous load comprises: a voltage detection circuit coupled to measure a voltage signal at an input of the autonomous load; a transient identification processor for extracting frequency and voltage harmonic transients and identifying individual load events corresponding to the extracted frequency and voltage harmonic transients; and an autonomous load controller configured to receive load event information from the transient identification processor and for providing a control signal to the autonomous load in response to the load event information.

In embodiments the autonomous load may include any one or all of the following features single or in combination including, but not limited to: the voltage detection circuit or autonomous load controller monitors an environment of the load; the autonomous load controller updates knowledge of a grid state and/or a load state; the autonomous load controller causes a load to change states; the autonomous load controller receives information on an operational state of a load and on external factors of the load and processes the operational state and external factor information in determining whether to cause a load to change states; a transient identification routine is triggered when an event is detected in either or both of a frequency or a harmonic data streams; wherein in response to a transient identification processor identifying an event as a power source on/off event or a load on/off event, the transient identification processor updates the autonomous load controller's knowledge of the grid state; wherein in response to the transient identification processor not recognizing an event, the autonomous load (e.g. via the transient identification processor) declares an event collision; wherein the transient identification processor is configured to identify a $7^{th}$ frequency harmonic characteristic.

In accordance with a further aspect of the concepts described herein, a method comprises: detecting a signal at an autonomous load, extracting information from the detected signal frequency and voltage harmonic transients from the detected voltage signal, based upon the information extracted from the detected signal, identifying an individual load event corresponding to the extracted frequency and voltage harmonic transients, and in response to the identified individual load event, providing one or more control signals to the autonomous load.

With this particular arrangement, a method for controlling an autonomous load is provided.

In embodiments, extracting information from the detected signal comprises extracting frequency and harmonic transients from the detected signal. In embodiments, detecting signal comprises detecting a voltage signal at an input of the autonomous load and extracting information from the detected signal comprises extracting frequency and voltage harmonic transients from the detected voltage signal.

In embodiments, based upon the information extracted from the detected signal, comprises extracting frequency and voltage harmonic transients from a detected voltage signal and identifying an individual load event corresponding to the extracted information comprises identifying an individual load event corresponding to the extracted frequency and voltage harmonic transients of the detected voltage signal.

In embodiments, the method further comprises monitoring an environment of the load.

In embodiments, the method further comprises updating autonomous load knowledge of a grid state and/or a load state.

In embodiments, the method further comprises causing a load to change states.

In embodiments, the method further comprises receiving information on an operational state of a load and on external factors of the load and processes the operational state and external factor information in determining whether to cause a load to change states.

In embodiments, the method further comprises performing a transient identification process in response to detection of an event in either or both of a frequency or a 7th harmonic data streams.

In embodiments, in response to a transient identification process identifying an event as a power source on/off event or load on/off event, updating the autonomous load's knowledge of the grid state.

In accordance with a further aspect of the concepts described herein, a system comprises an electrical power grid, a bank of power sources coupled to the electrical power grid and one or more autonomous loads coupled to the electrical power grid, each of the one or more autonomous loads configured to draw power from the electrical power grid and each of the one or more autonomous loads comprising: a detection circuit configured to measure, sense or otherwise detect a characteristic of a signal provided to the autonomous load, an event identification processor for extracting and identifying a load event based upon signal measured, sensed or otherwise detected by the detection circuit; and an autonomous load controller configured to receive load event information from the event identification processor and for providing a control signal to the autonomous load in response to the load event information.

With this particular arrangement, an autonomous load capable of changing its operating state in response to load event information is provided. For example, in response to receiving load event information which indicates that another load coupled to the same electrical grid as the autonomous load has changed its state (e.g. the other load has turned on, turned, off, slowed down, sped up, is drawing more or less power from a grid, etc. . . . ) the autonomous load can change its state accordingly. For example, in response to an autonomous load receiving load event information which indicates that another load has changed its state from off to on, the autonomous load may change its state from on to off. In this example, the autonomous load may change its state to off to prevent drawing more power than can be sourced by the electrical grid to which both loads are coupled.

In embodiments, the detection circuit is configured to measure, detect or otherwise sense, a characteristic of one or more signals provided to the autonomous load. In embodiments, the detection circuit is configured to measure, detect or otherwise sense one or more of: a power signal, a voltage signal or a current signal. In embodiments, the one or more signals measured, detected or otherwise sensed by the detection circuit may be one or more an analog signals, one or more digital signals or a combination of one or more analog and digital signals. In embodiments, the detection circuit may be configured to measure, detect or otherwise sense signal characteristics including but not limited to: signal transients (including characteristics of amplitude and frequency transients); changes in signal transients; signal frequencies and/or amplitudes; changes in signal frequencies and/or amplitudes, signal waveforms; changes in signal waveforms; power levels (e.g. minimum, average and/or peak power levels); and/or changes in power levels.

In embodiments, the event identification processor comprises a transient identification processor configured to extract information from transient characteristics of the signal measured or otherwise obtained by the detection circuit.

In embodiments, the autonomous load may further comprise communication means for signaling or otherwise communicating with other autonomous loads or other systems such as other control systems. In embodiments, such communication means may be implemented as power line carrier communication system, a wire-based communication system (e.g. telephone networks, or ethernet networks, and fiber-optic networks, waveguide transmission lines), or wireless communication system (e.g. a cellular transceiver or other type of transceiver for performing packet-based communication). Other forms of signaling may also be used.

In embodiments, the one or more autonomous loads may comprise a voltage detection circuit configured to measure voltage values at an input to a load, a transient identification processor configured to receive the measured voltage values from the voltage detection circuit and configured to process the voltage values to identify frequency variations and harmonics in the voltage signals to identify a transient and to compare the transient to an exemplar.

In embodiments, the power source bank comprises a plurality of generators.

In embodiments, the power sources may be provided as one or more of fuel operated generators, solar generators and wind power turbines.

In embodiments, the electrical power grid corresponds to a microgrid.

In embodiments, the autonomous load controller monitors one or both of an external or an internal environment of the load.

In embodiments, the autonomous load controller updates knowledge of a grid state and/or a load state.

In embodiments, the autonomous load controller causes a load to change states.

In embodiments, the autonomous load controller receives information on an operational state of a load and on external factors of the load and processes the operational state and external factor information in determining whether to cause a load to change states.

In embodiments, a transient identification routine is triggered in response to an event being detected in either or both of a frequency data stream or a harmonic data stream.

In embodiments, the harmonic data stream is a 7th harmonic data stream.

In embodiments, in response to the transient identification processor identifying an event as a power source on/off event or load on/off event, the transient identification processor updates the autonomous load controller's knowledge of the grid state.

In embodiments, in response to the transient identification processor not recognizing an event, the transient identification processor declares an event collision.

In accordance with a still further aspect of the concepts described herein, an autonomous load comprises: a voltage detection circuit coupled to measure a voltage signal at the input of the autonomous load, a transient identification processor for extracting frequency and voltage harmonic transients and identifying an individual load events corresponding to the extracted frequency and voltage harmonic transients; and an autonomous load controller configured to receive load event information from the transient identification processor and for providing a control signal to the autonomous load in response to the load event information.

With this particular arrangement, an autonomous load capable of changing its operating state in response to load event information is provided. For example, in response to receiving load event information which indicates that another load coupled to the same electrical grid as the autonomous load has changed its state (e.g. the other load has turned on, turned off, slowed down, sped up, is drawing more or less power from a grid, etc. . . . ) the autonomous load can change its state accordingly. For example, in response to an autonomous load receiving load event information which indicates that another load has changed its state from off to on, the autonomous load may change its state from on to off. In this example, the autonomous load may change its state to off to prevent drawing more power than can be sourced by the electrical grid to which both loads are coupled.

BRIEF DESCRIPTION OF THE DRAWINGS

The foregoing and other objects, features and advantages will be apparent from the following more particular description of the embodiments, as illustrated in the accompanying drawings in which like reference characters refer to the same parts throughout the different views. The drawings are not necessarily to scale, emphasis instead being placed upon illustrating the principles of the embodiments.

FIG. 20 is a plot of a number of power sources and loads online vs. time (minutes);

FIG. 20A is a plot of frequency (Hz) vs. time (minutes) for the online power sources and loads online shown in FIG. 20;

FIG. 20B is a plot of in-phase $7^{th}$ harmonic values (volts) vs. time (minutes) for the frequencies shown in FIG. 20A;

DETAILED DESCRIPTION

Figure 1:
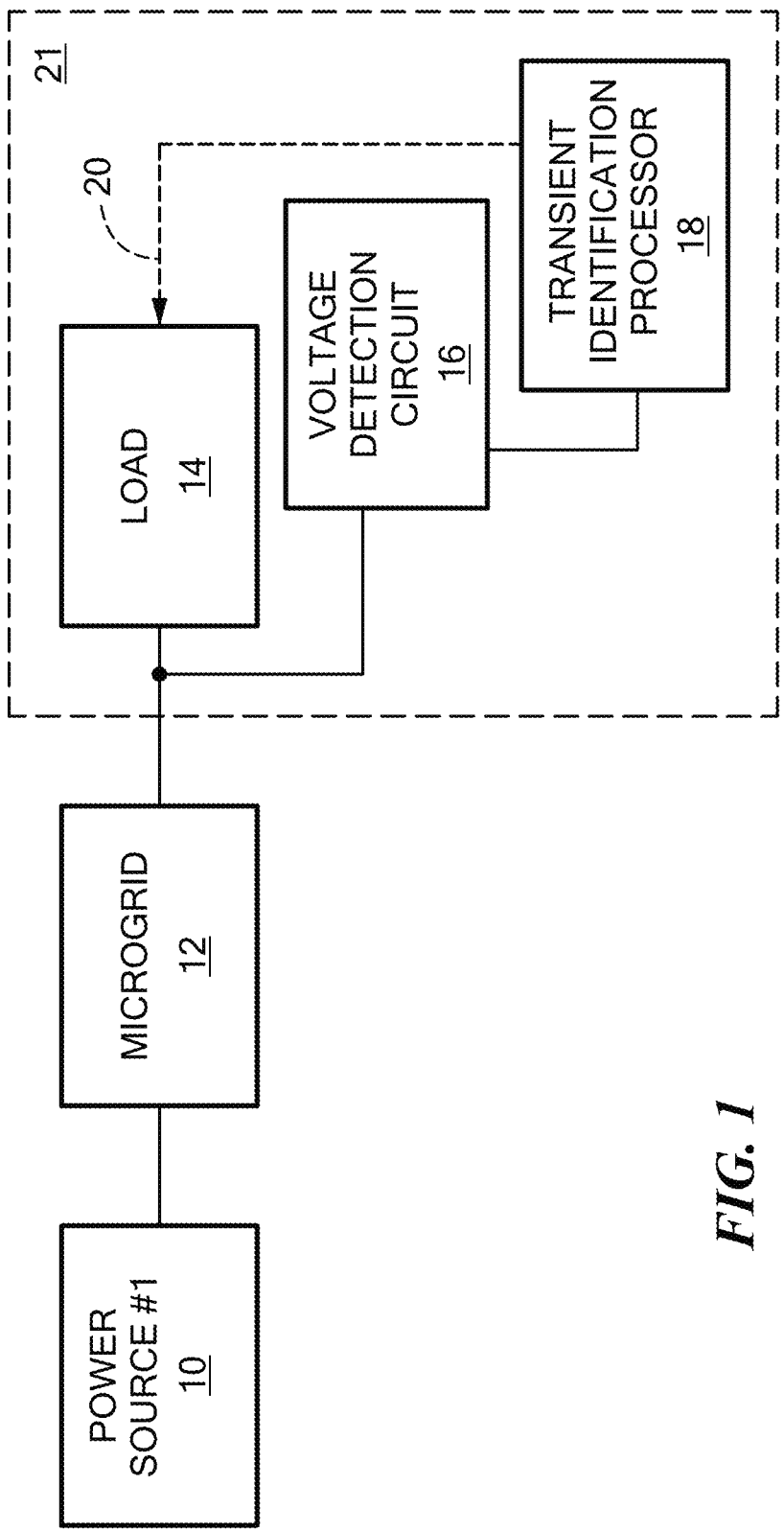
FIG. 1 is a block diagram of a system comprising a transient identification processor.

Referring now to FIG. 1, a power source 10 generates a power which is coupled or otherwise provided to a grid 12. Power source 10 may be provided as any type of power source capable of being coupled to grid 12. For example, power source 10 may be provided as any of a generator including, but not limited to a fossil fuel powered generator, a solar powered generator, a wind powered generator a hydro-powered generator, a fuel-cell with power electronics, a battery with power electronics, or other sources of electrical energy and storage.

It should be noted that grid 12 may correspond to a portion of a larger electrical grid system or may correspond to a microgrid. A load 14 coupled to grid 12 draws power from the grid. A voltage detection circuit 16 is coupled to non-intrusively measure or otherwise detect values of a voltage (e.g. a utility voltage) received by load 14. Such detected voltage values (which may be analog signals or digital data values) are provided to an input of a transient identification processor 18.

Transient identification processor receives the signals provided thereto and processes the signals to identify load operation characteristics or "signatures." Thus, in embodiments, strictly from measurements of a utility voltage and using the techniques described in detail herein below, transient identification processor 18 is able to identify load operation characteristics. Techniques used by transient identification processor 18 to identify load signatures are described hereinbelow in conjunction with at least FIGS. 3 and 6-17.

By identifying load signatures, transient identification processor is able to detect power events and identify them strictly from changes in a voltage waveform of the utility. Voltage-only load identification means that any load on a local utility network coupled to a transient identification processor can, in principle, identify the operating schedule of loads in the network neighborhood. With this approach, the utility itself effectively doubles as a load-monitoring information exchange network.

The signature identification techniques utilized by transient identification processor and described herein are particularly applicable in low-inertia microgrids or "street-level" distribution networks where a utility may not be "stiff" due to generator limitations or impedance from a local distribution transformer, for example.

Among other uses, such signature information could be used for control of loads coupled to the grid including, but not limited to, cyclically operating loads (i.e. load which sporadically or periodically draw power from the grid) and high demand loads (i.e. loads, which when operating, draw an amount of power from the grid which is relatively large compared with the amount of power drawn by other loads on the grid or which is relatively large compared with the amount of power available from the grid).

In embodiments, transient identification processor 18 may thus be optionally be coupled 20 to load 14 or to another device (not shown) such as a processing device which may be separate or integral with the load. Thus, information determined by transient identification processor 18 may be utilized to control aspects of the operation of load 14 or to control other aspects of the power source 10 or the grid 12.

In embodiments, load 14 may be a conventional electrical load having voltage detection circuit 16 and transient identification processor 18 coupled thereto. In embodiments, one or both of voltage detection circuit 16 and transient identification processor 18 may be separate from load 14. In embodiments, one or both of voltage detection circuit 16 and transient identification processor 18 may be provided as an integral part of load 14.

Figure 2:
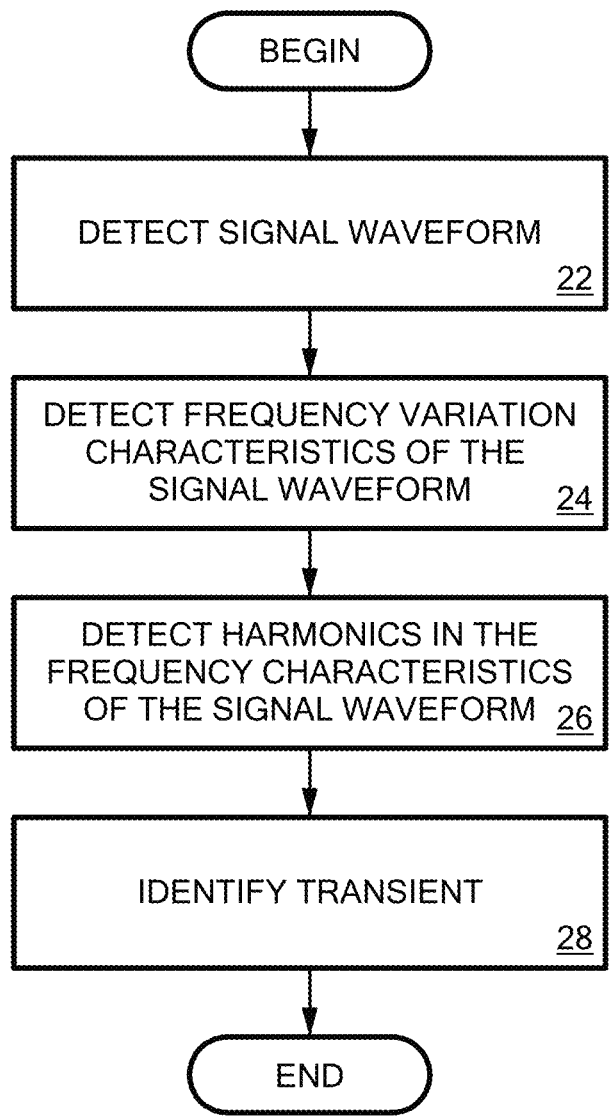
FIG. 2 is a flow diagram of an illustrative process for identifying a voltage waveform transient.

FIG. 2 is a flow diagram showing illustrative processing that can be implemented within an autonomous load as discussed above and, more particularly, within a transient identification processor, such as the transient identification processor 18 described above in conjunction with FIG. 1. Rectangular elements (typified by element 22 in FIG. 2), are herein denoted "processing blocks," and represent computer software instructions or groups of instructions. Alternatively, the processing blocks may represent steps or processes performed by functionally equivalent circuits such as a digital signal processor circuit or an application specific integrated circuit (ASIC). The flow diagram does not depict the syntax of any particular programming language, but rather illustrates the functional information one of ordinary skill in the art requires to fabricate circuits or to generate computer software to perform the processing described. It should be noted that many routine program elements, such as initialization of loops and variables and the use of temporary variables are not shown. It will be appreciated by those of ordinary skill in the art that unless otherwise indicated herein, the particular sequence of blocks described is illustrative only and can be varied without departing from the spirit of the concepts, structures, and techniques sought to be protected herein. Thus, unless otherwise stated the blocks described below are unordered, meaning that, when possible, the functions represented by the blocks can be performed in any convenient or desirable order.

Turning now to FIG. 2, as shown in processing block 22, a transient identification technique begins by detecting or otherwise receiving, sensing or identifying a signal waveform such as a voltage waveform. Processing them proceeds to processing block 24 in which frequency variation characteristics of the signal waveform are identified. Such harmonics may be viewed and/or identified, for example, on spectrum analyzer or other type of signal analyzers.

Processing then proceeds to processing 26 in which harmonics in the frequency characteristics of the signal waveform are identified. Based upon the frequency harmonic signals, the system identifies a transient as shown in processing block 28.

Figure 3:
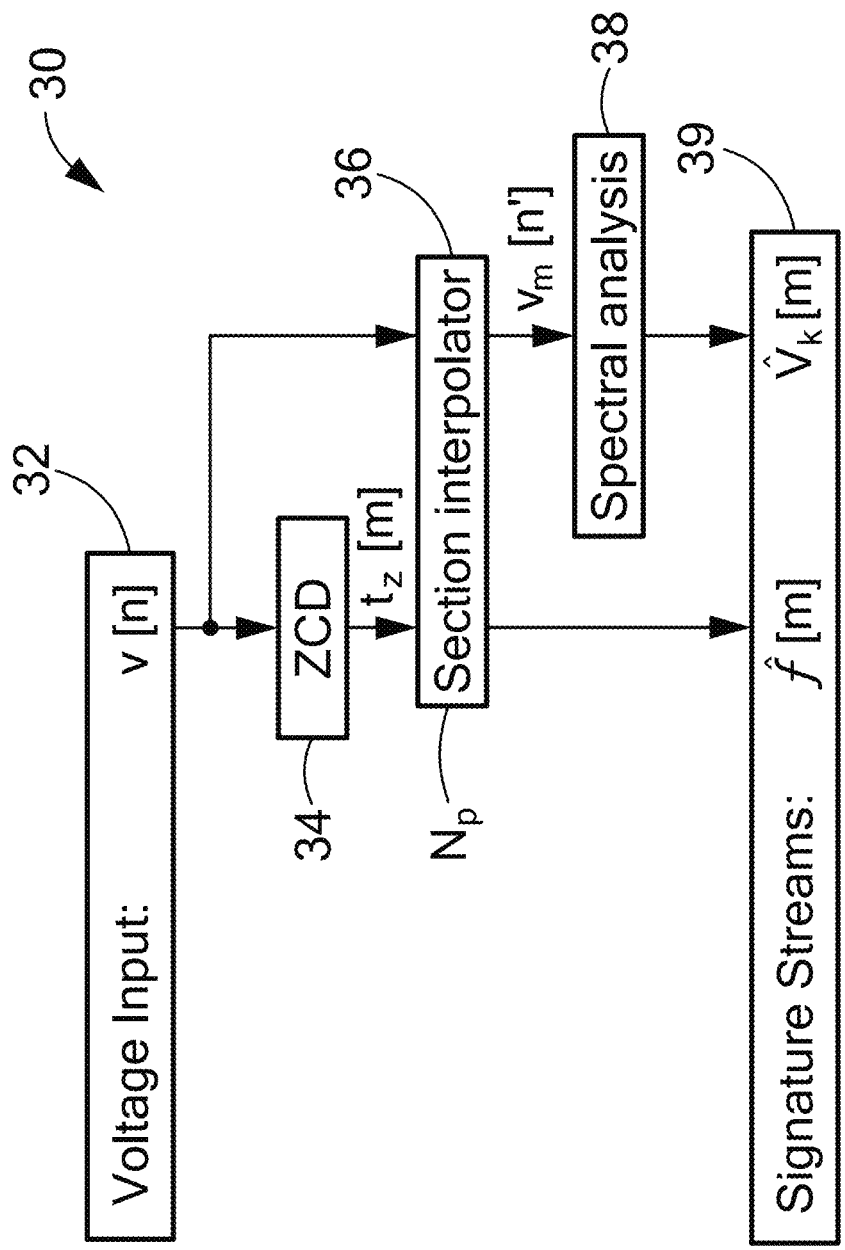
FIG. 3 is a block diagram of signal processor appropriate for use in systems such as those shown in any of FIGS. 1, 4, 5 and 21 for performing a signal extraction process from voltage measurements.

Referring now to FIG. 3, a signature extraction pipeline 30 which may, for example, be implemented as part of a transient identification processor such as transient identification processor 18 described in FIG. 1, takes as input 32 a voltage signal. In embodiments, the input 32 may be provided as a single-phase voltage. In embodiments, the input 32 may be provided as a multi-phase voltage. In embodiments, the voltage signal, may be provided as digital data such as one or more digital bits. In embodiments, the digital data may be provided as a sequence or stream of digital bits denoted v[n], where n is an integer and represents a sample index such that v[1] (i.e. n=1) corresponds to the first sample of voltage signal v. In embodiments, the digital data is the sampled with frequency, $f_s$. The stream of digital bits v[n], are processed to produce time-series "streams" of frequency estimates (denoted $\hat{f}[m]$), and voltage harmonic coefficient estimates (denoted $V_k[m]$), at a rate double the line frequency, i.e., the rate of zero-crossings in the line voltage.

As shown in FIG. 3, from the digital data stream v[n], the process first estimates the times of voltage zero-crossings via a zero crossing detector (ZCD) module 34. In one embodiment, this may be accomplished by interpolating between the voltage data points just before, $v[n^-m]$, and just after, $v[n^+m]$, the $m^{th}$ zero crossing. Any type of interpolation technique may be used. In embodiments in which the ZCD linearly interpolates between data points, zero-crossing stream data $\hat{t}_z[m]$ may be computed as:

$$\hat{t}_z(m) = t[n_m^-] - \frac{v[n_m^-]}{f_s(v[n_m^+] - v[n_m^-])}. \quad (1)$$

in which:
  m is an index representing a number of a zero crossing;
  t[n⁻m] is a time of voltage zero crossing at a voltage data points just before the $m^{th}$ zero crossing;
  v[n⁻m] is a voltage data points just before the $m^{th}$ zero crossing;
  v[n⁺] is a voltage data points just after the $m^{th}$ zero crossing; and
  $f_s$ is a sampling frequency.

Other interpolation techniques, may of course, also be used.

Thus, zero crossing detector 34 generates or otherwise produces a stream of data referred to as a zero-crossing stream data (denoted $t_z[m]$) corresponding to the zero crossings of the sampled voltage signal. Zero crossing detector 34 provides the zero-crossing stream data $\hat{t}_z[m]$ to a section interpolator module 36. Section interpolator module 36 receives the zero-crossing stream data and also receives sampled voltage signal data v[n] 35. In response to the signals provided thereto (i.e. the $\hat{t}_z[m]$ and v[n] data), the section interpolator module 36 estimates the average frequency across the $m^{th}$ data section of length $N_p$ voltage periods as, $$\hat{f}[m] = \frac{N_p}{\hat{t}_z[m+N_p] - \hat{t}_z[m-N_p]}. \qquad (2)$$

The section interpolator module 36 then resamples the voltage waveform section at the rate, $$f'_s[m] = \frac{N'[m]}{N_p}\hat{f}[m], \qquad (3)$$

where $$N'[m] = \left\lceil N_p \frac{f_s}{\hat{f}[m]} \right\rceil, \qquad (4)$$

is the number of new samples over the $N_p$ period-length section. Here, the symbols ⌈ ⌉ represent the ceiling function meaning that N'[m] is the integer value larger than the "prorated" number of samples between voltage zero-crossings, m−$N_p$ and m+$N_p$. In this way, $f_s$[m] is the smallest sample rate higher than $f_s$ that results in an integer number of samples in the data section (and ideally, results in an exact integer number of samples in the data section). This process reduces the variance of the spectral leakage errors by aligning the frequency bins of the spectral analysis with the fundamental and harmonic frequencies of interest.

A spectral analysis processor 38 computes or otherwise determines the coefficients for these components. In embodiments, the coefficients for these components may, for example, be calculated via a discrete Fourier Transform (DFT), as:

$$\hat{V}_k[m] = \sum_{n'=0}^{N'-1} v_m[n'] e^{-j2\pi k n'/N'}. \qquad (5)$$

In this way, signature extraction pipeline 30 produces signature streams 39 comprised of a first signature stream (i.e. a frequency stream $\hat{f}[m]$ corresponding to the average frequency across the $m^{th}$ data section of length $N_p$ voltage periods), and a second signature stream (i.e. a harmonic stream $\hat{V}_k[m]$) which may be used to assess grid events through voltage monitoring. Thus, it has been discovered that a combination of harmonic streams and frequency streams provides unique identification of loads on many grids including but not limited to microgrids.

Figure 4:
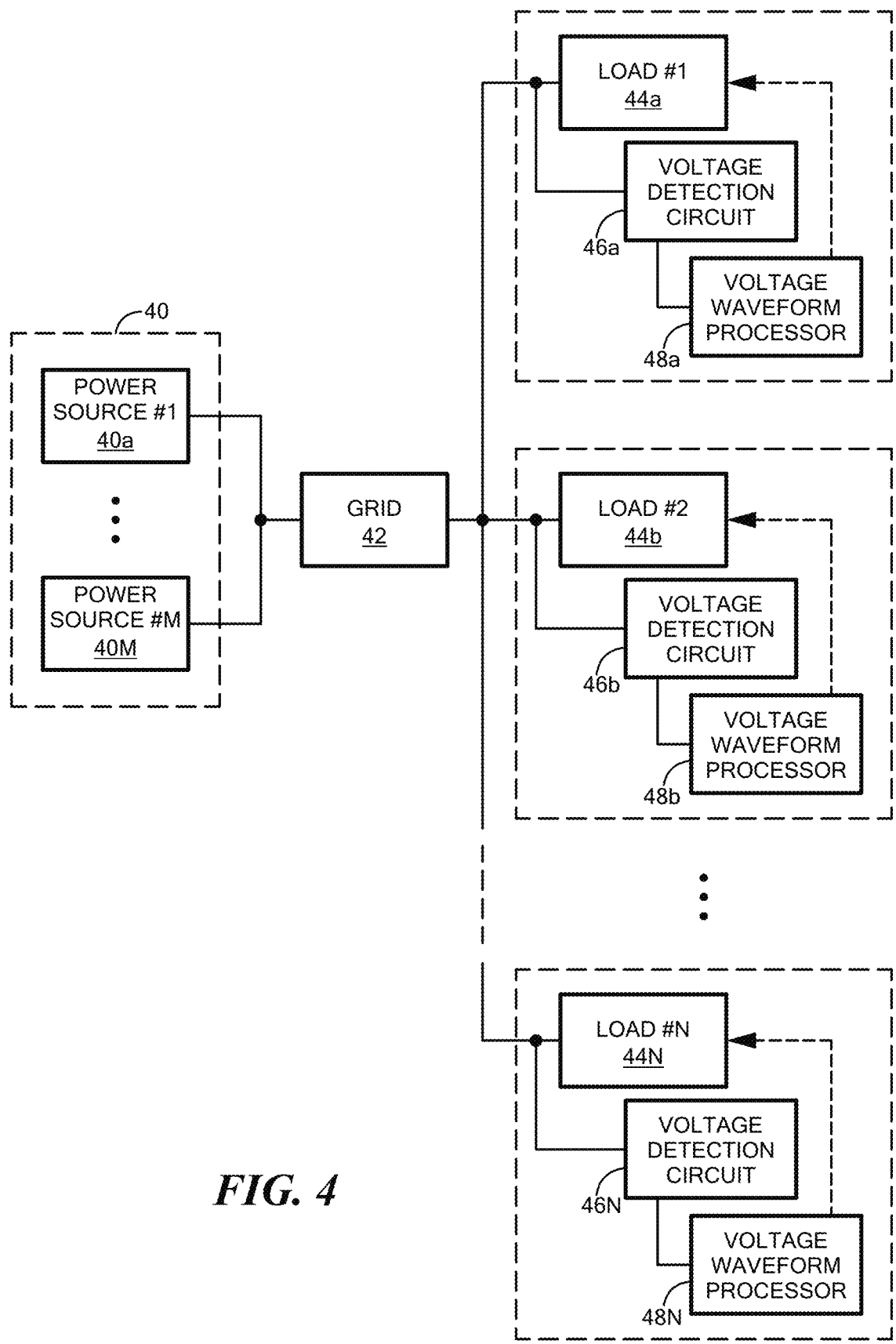
FIG. 4. is a block diagram of a system comprising multiple power sources coupled to one or more loads through a microgrid.

Referring now to FIG. 4, a power source bank 40 may provide electrical service to an electrical grid 42 (also sometimes referred to as an "electric grid," a "power grid" or more simply a "grid") 42. In this illustrative embodiment, power source bank 40 is here shown to include M power sources denoted 40a-40M. It should, of course, be appreciated that power source bank 40 may include any number of power sources (e.g. one or more power sources) and that the power sources may be any type of electrical power source including but not limited to fuel operated generators (e.g. fossil fuel operated generators), solar generators, wind power turbines, to name but a few different types of power sources. It should also be noted that at any point in time, one, some or all of the M power sources may act to source electrical power to the grid 42. It should also be noted that grid 42 may correspond, for example, to a portion of a larger electrical grid system or may correspond to a microgrid.

A plurality of loads 44a-44N are coupled to grid 42 and are capable of receiving power via the grid. It should be noted that at any point in time, one, some or all of the N loads may draw power from grid 42. Each load 44a-44N has coupled thereto a corresponding one of a plurality of voltage detection circuits 46a-46N. Voltage detection circuits are coupled to measure or otherwise detect values of a voltage (e.g. a utility voltage) provided to the corresponding load to which it is coupled. In embodiments, the voltage detection circuits are coupled to non-intrusively measure or otherwise detect values of a voltage (e.g. a utility voltage) provided to the corresponding load. Each voltage detection circuit 46a-46N has coupled thereto a corresponding one of a plurality of transient identification processors 48a-48N. Voltage values (which may be analog signals or digital data values) detected by the voltage detection circuits are provided to inputs of the respective ones of the transient identification processors.

The transient identification processors receive the signals provided thereto and process the signals to identify load operation characteristics or "signatures" of the respective loads. Thus, in embodiments, strictly from measurements of a utility voltage, the transient identification processors may identify load operation characteristics.

Such techniques may be particularly applicable in low-inertia microgrids or "street-level" distribution networks where a utility may not be "stiff" due to generator limitations or impedance from a local distribution transformer. Among other uses, and as will be explained in detail below in conjunction with FIGS. 18-27, this information could be used for autonomous control of loads including, but not limited to cyclically operating loads (i.e. load which sporadically or periodically draw power from the grid) and high demand loads (i.e. loads, which when operating, draw an amount of power from the grid which is relatively large compared with the amount of power drawing by other loads on the grid or which is relatively large compared with the amount of power available from the grid).

Transient identification processors 48a-48N may also be coupled to corresponding ones of loads 44a-44N and may be configured to control at least some operation of a load to which it is coupled. In this case (i.e. when a transient identification processors is coupled to a load) the load may be referred to as an "autonomous load" or as a "self-driving load" (i.e. a load which utilizes signature information generated by a transient identification processors and uses the signature information to operate in accordance with an autonomous control scheme). Examples of autonomous loads will be described in detail below in conjunction with FIGS. 18-27.

As noted above in conjunction with FIG. 1, in embodiments, one or more loads may be conventional electrical loads having a separate voltage detection circuit and transient identification processor coupled thereto (i.e. one or both of voltage detection circuit and transient identification processor may be separate from the load). In embodiments, one or more loads may have the voltage detection circuit and transient identification processor provided as an integral part of thereof.

Figure 5:
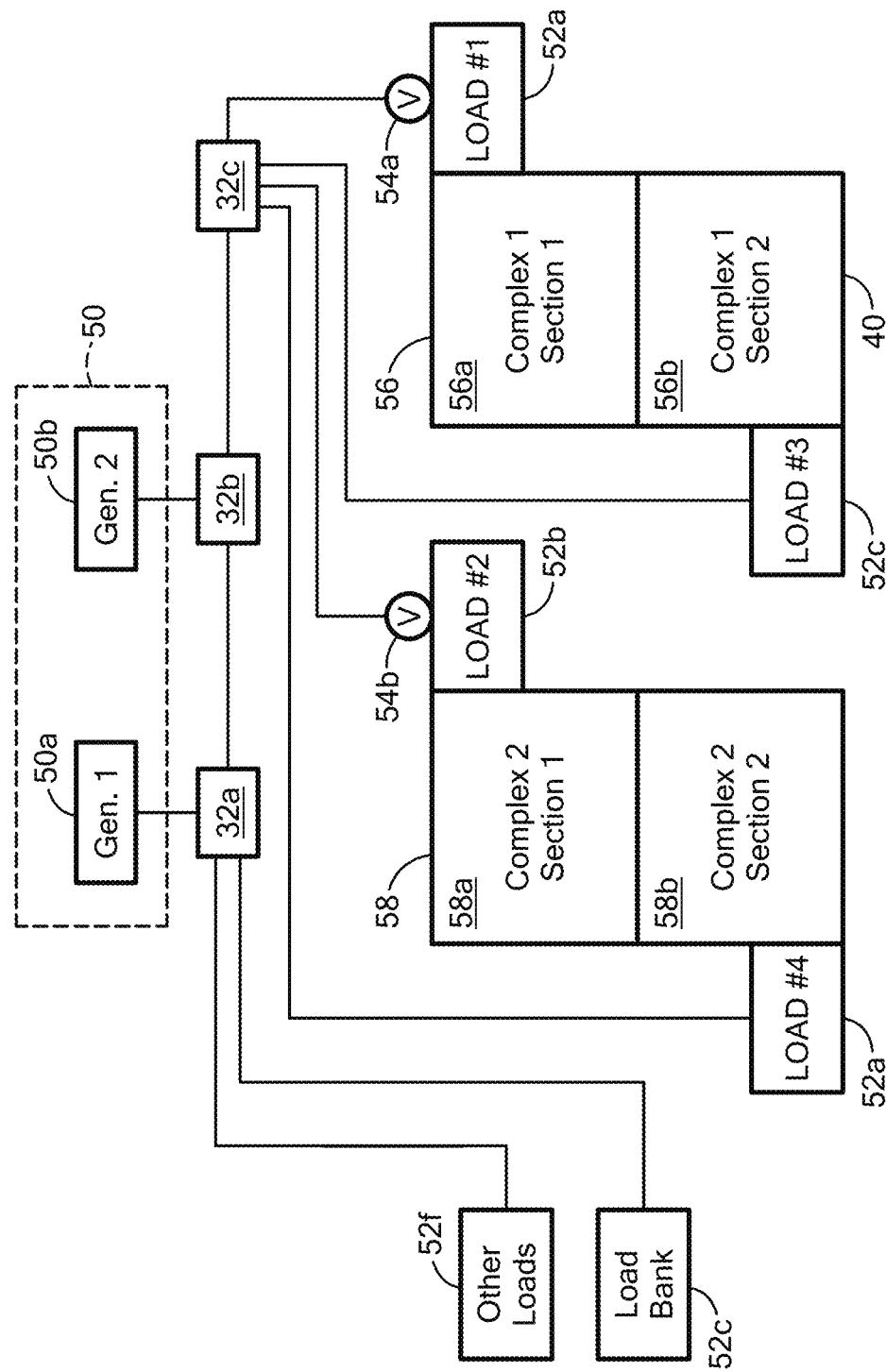
FIG. 5 is a bock diagram of a system comprising one or more power sources coupled through a grid to one or more electrical loads with at least one load having a transient identification processor coupled thereto.

Referring now to FIG. 5, an illustrative islanded microgrid is powered by a generator bank 50 (with two generators 50a, 50b being shown). The generator bank 50 sources power to a plurality of loads 52a-52f. In this illustrative embodiment, voltage meters 54a, 54b are coupled respective ones of loads 52a, 52b. In embodiments, the voltage meters may be coupled to utility panels of loads 52a, 52b.

The loads may be provided as any type of load. Loads 52a-52d may, for example, be provided as cyclical loads such as an environmental control unit (ECU). Each load 52a, 52b also includes a transient identification processor.

The responses of the line voltage to load turn-on/off events, generator dispatch/secure events (hereby referred to as generator turn-on/off events, respectively), and the turn-on/off events of other loads may be measured by volt meters 54a, 54b and the measure data may be provided to the respective transient identification processor for processing. In particular the measured data may be analyzed to extract operation signatures e.g. using the process of FIG. 3. Further, using a cross-correlation based transient identification technique, load event recognition may be performed using the extracted signatures.

To promote clarity in the description of the broad concepts sought to be protected herein, an example embodiment will be described herein below in which the generator and loads are described with particularity. The example described below is not intended to be and should not be, construed as limiting.

In one example embodiment, the generator bank 50 includes two 60 kW synchronous diesel generators under dispatch control which source 120/208V, 60 Hz service to the microgrid. Thus, in this example a bank of interconnected diesel generators that serve (i.e. provide power to) the microgrid.

The loads are provided as environmental control units (ECUs) 52a-52c which provide heating and cooling to respective one of buildings 56, 58 (or sections 56a, 56b, 58a, 58b of buildings 56, 58). Each ECU 52a-52c operates independently from other ECUs in neighboring buildings (or in different sections of the same building). Simply, the local temperature conditions determine the activation time for each ECU. Periodically, ECU activation times can align resulting in many ECUs being on at the same time and a maximum demand on the utility.

In accordance with the concepts described herein, it has been recognized that nonintrusive voltage signals indicating the operation of local loads are most easily derived in situations where the information is most likely to be helpful. That is, small grids or subsections of the grid are more likely to display voltage distortions, e.g., frequency deviations and harmonic content, that can be used as information for load control. Such distortions can be especially noticeable on islanded microgrids, where generation capacity and individual load demand may be comparable.

For example, if heaters within the ECU have a 10 kW rating they may consume approximately 17% of the rated power of a single 60 kW diesel generator.

On such microgrids, electrical transients result in grid frequency deviations due to the finite bandwidth associated with synchronous generator field controllers and speed governors, as well as the frequency control of power electronic inverters connecting renewables or energy storage devices. Such sources also typically exhibit load dependent harmonic voltage distortion, which is further exacerbated by modern nonlinear loads whose non-sinusoidal currents manifest as voltages as currents flow through the impedances of the grid As a corollary, frequency and harmonic deviations also occur when generators come on-line or go off-line to match load demand. These deviations can serve as signatures to identify the load and generation status of the grid.

In the illustrative embodiment of FIG. 5, one or both of two generators may provide 120/208V, 60 Hz service to the microgrid.

Also in the illustrative embodiment of FIG. 5, the loads are coupled radially to a point of common coupling with the generators. In embodiments in which the loads correspond to ECUs, the ECUs may each provide heat to a section of a building structure. In addition to the ECUs a three-phase variable-resistive load bank 52c capable of up to approximately 25 kW is connected to the grid. Other loads 52f, e.g., lighting, plug loads, pumps, may also be coupled to the grid and operating. These loads draw much smaller currents than the ECUs and do not create significant voltage transients.

The response of the line voltage to ECU, pump, and generator events was measured under a variety of base load and generator configurations. Generator events occurred according to their dispatch control rules which, in this example system, dictate a second generator coming online after loads in excess of 48 kW (80% single generator capacity) for 10 consecutive seconds, and going offline after loads below 36 kW (60% single generator capacity) for 5 consecutive minutes. This may result in numerous (e.g. several hundred) ECU turn-on/off transients, eight generator turn-on transients, seven generator turn-off transients, and four latrine pump turn-on transients over a period of time. Data collected may be processed for event signatures.

In embodiments, the voltage meters may sample voltage at a sampling frequency ($f_s$) of about 8 kHz with a 10-bit resolution. The data may be analyzed over $N_p=6$ period-length windows. In this illustrative embodiment, It was found that $N_p=6$ period-length windows was a length which provided a good tradeoff between "smoothing" measurement and process noise and capturing frequency and harmonic features related to grid transients.

Spectral analysis was performed for the fundamental and the $3^{rd}$, $5^{th}$ and $7^{th}$ harmonics, as these lower odd harmonics are often-present artifacts of load induced and synchronous generation distortion. Of these harmonic streams, the $7^{th}$ harmonic estimate, $V_7$ [m], proved most useful and when combined with the frequency estimate stream, f[m], was sufficient for identifying all major electrical events in the system.

Next described are characteristics of event transient signatures. It has been found that the voltage transients induced by electrical events vary in character depending upon how many power sources are operating, the types of power sources (e.g. fossil fuel generators vs. wind-powered generators vs. solar-powered generators) and how much power they are supplying (base load) before the transients occur. Thus, each transient can be categorized as an "event type" based upon the load action that caused it, the number of generators running prior to it, and the total base load prior to it.

With respect to frequency signatures, it was also found that the largest loads (e.g. ECU heaters and pumps in the example system) coupled to the grid create larger frequency deviations than other loads.

Figure 6:
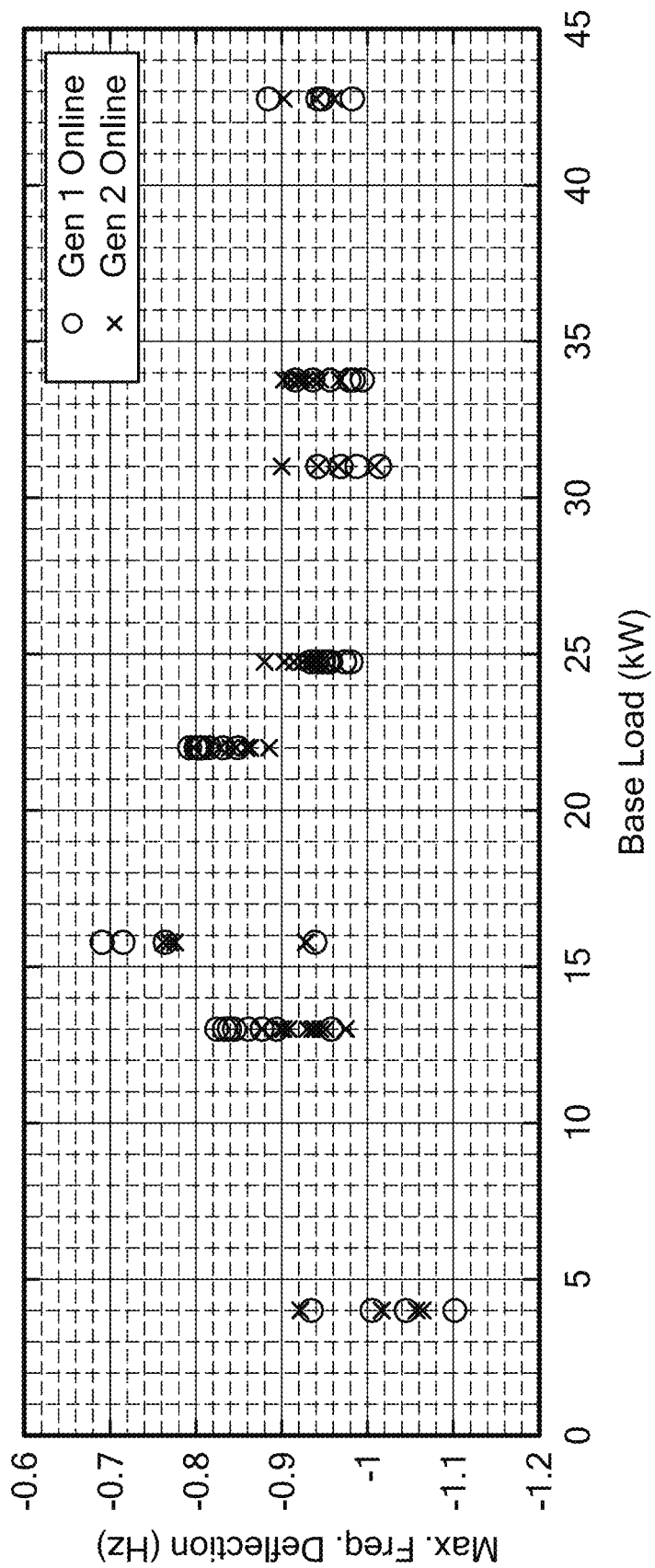
FIG. 6 is a plot of maximum frequency deflection (Hz) vs. a base load (kW)

FIG. 6 shows the maximum frequency deflection as a function of base load for all ECU turn-on events when only one generator (e.g. one of generators 50a, 50b in FIG. 5) was powering the grid. FIG. 6 reveals a moderate dependency between the size of the frequency transients and the base load at the time of the ECU event. A plot of ECU turn-off event maximum frequency deflections would look similar in shape but reflected about the x-axis and shifted out approximately 10 kW as events are categorized by the base camp draw leading up to each event.

Interestingly, ECU transients take on one of two distinct shapes when only 1 generator is running.

Figures 7, 7A:
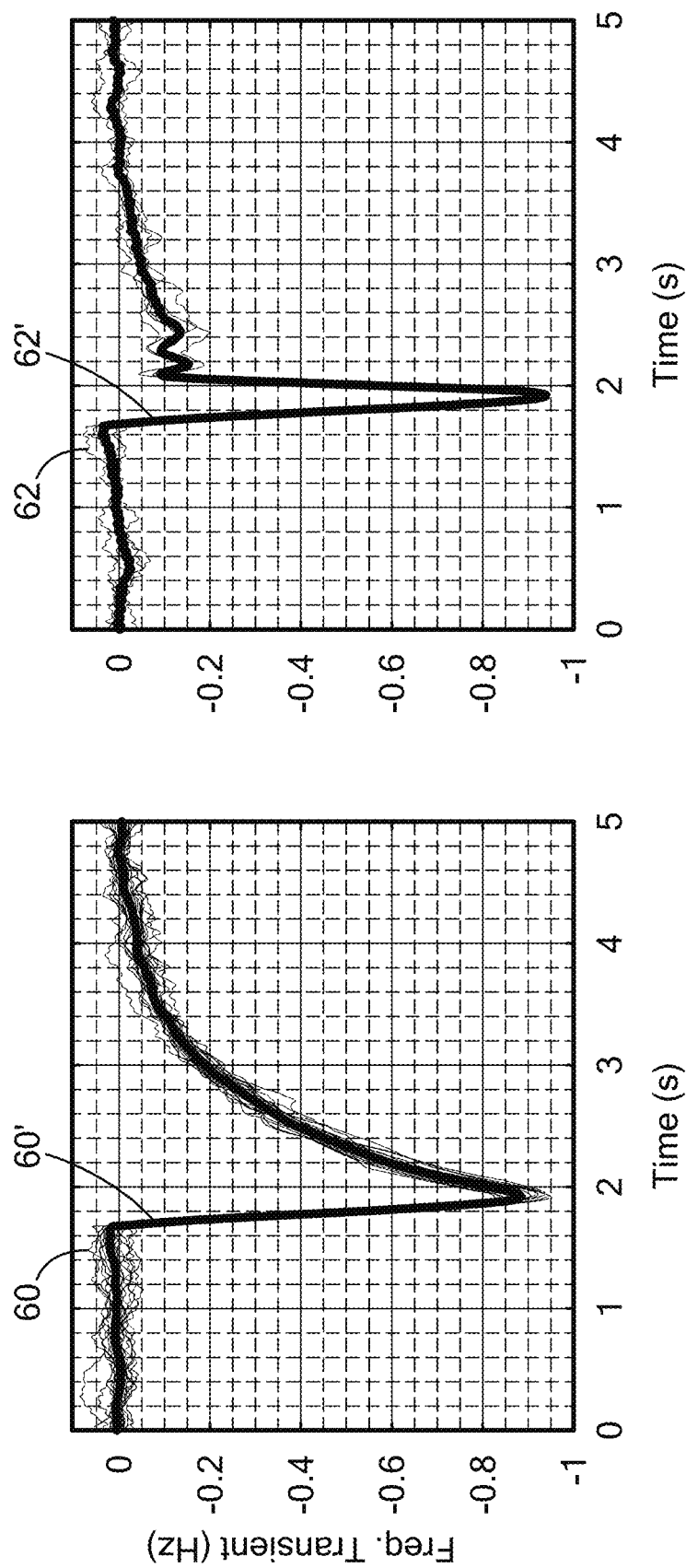
FIG. 7 is a plot of frequency transients (Hz) vs. time (seconds)
FIG. 7A is a plot of frequency transients (Hz) vs. time (seconds)

Referring now to FIGS. 7, 7A, curves 60, 62 represent each ECU turn-on transients corresponding to a base load of approximately 13 kW. Here, the faint lines 60, 62 are the individual transients, and the black lines 60', 62' are time-averaged composite waveforms (referred to herein as an "exemplar"). Most transients look like the exemplar in FIG. 7, where the frequency deviation is arrested and brought smoothly back to its nominal value over the course of about 1.5 s. Occasionally though, the frequency is arrested and "aggressively" brought back near its nominal value in less than 0.5 s, as shown in FIG. 7A. ECU turn-off events create similar, but opposite in sign, transients. These differing behaviors may be a result of time-varying and/or nonlinear control in the generators' frequency regulators.

Figure 8:
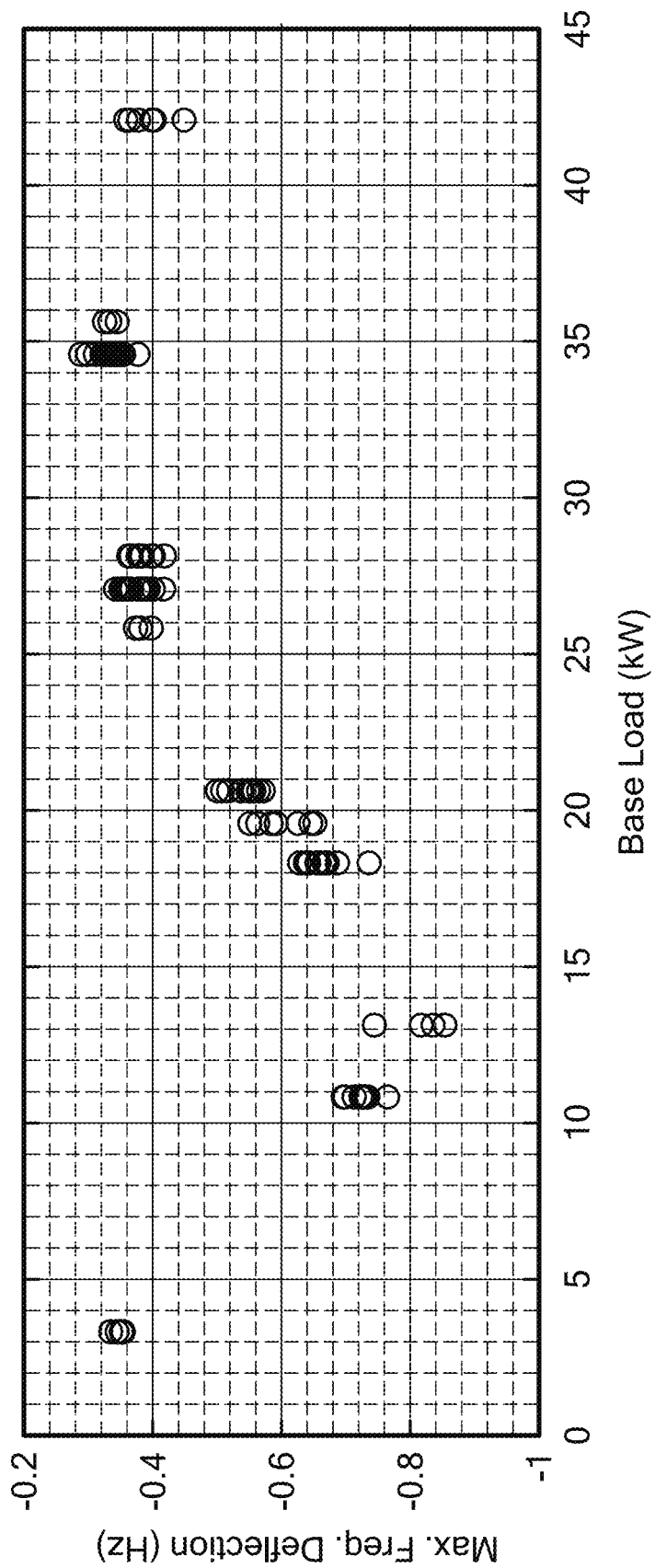
FIG. 8 is a plot of maximum frequency deflection (Hz) vs. a base load (kW)

Referring now to FIG. 8, when both generators 50a, 50b operate in parallel, the peak frequency deviation of an ECU turn-on or turn-off transient are generally smaller, but vary more significantly with base load as shown in FIG. 8. Unlike the transients when one generator is operating, these transients only take on a shape similar to shape illustrated in FIG. 7.

Generator turn-on events were not found to create significant frequency transients, with maximum frequency deflections smaller than 200 MHz regardless the base load. Generator turn-off events, however, did induce significant frequency transients at larger base loads, but not at smaller ones.

Figures 9, 9A, 9B:
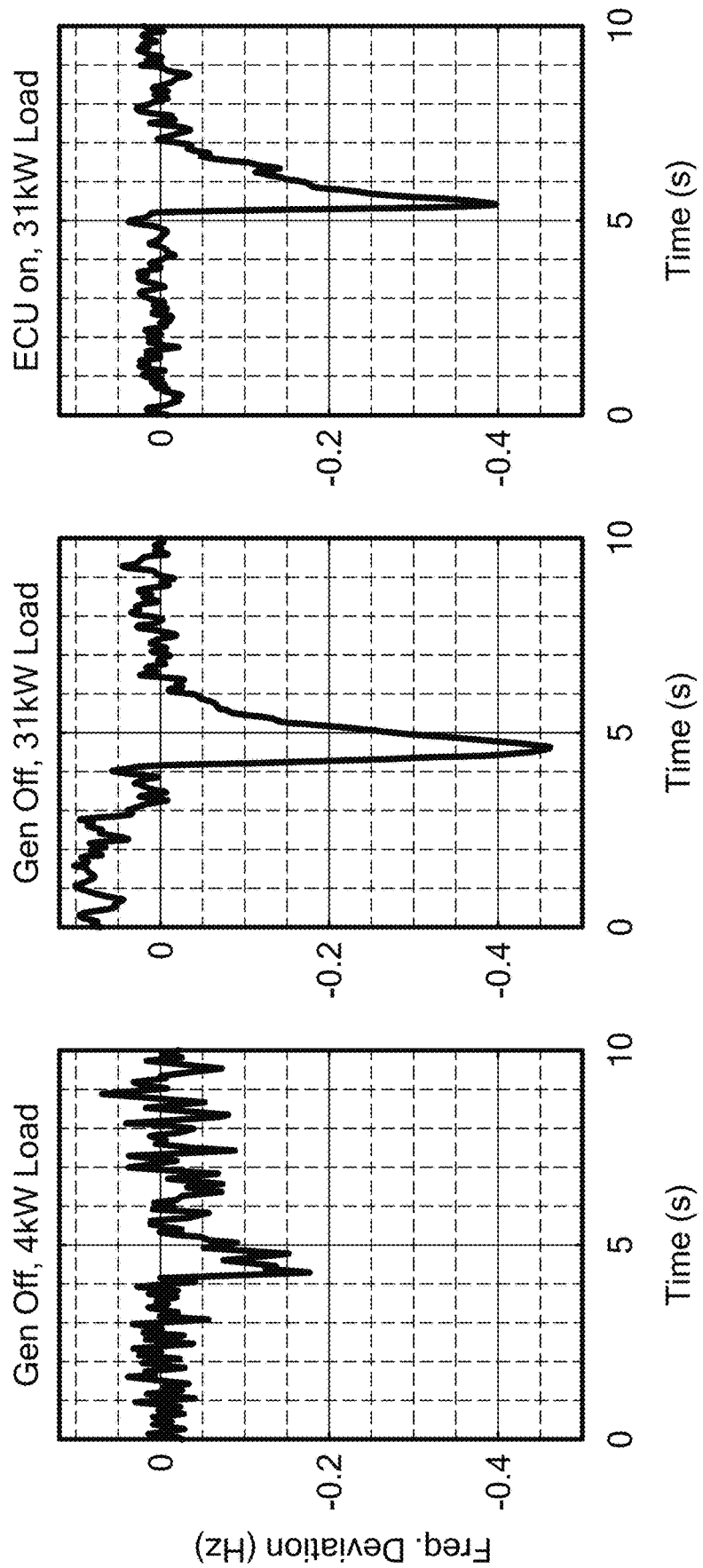
FIGS. 9-9B are a series of plots illustrating frequency deviation (Hz) vs. time (seconds)

FIGS. 9-9B depict example frequency deviations for base loads of 4 kW (FIG. 9) and 31 kW (FIG. 9A). At low loads, the transient is small and difficult to identify. However, at higher loads, generator turn-off events produce easily detected frequency transients, but ones that closely resemble those induced by some ECU turn-on events when two generators are operating, e.g., the ECU turn-on event shown in FIG. 9B.

Figure 10A:
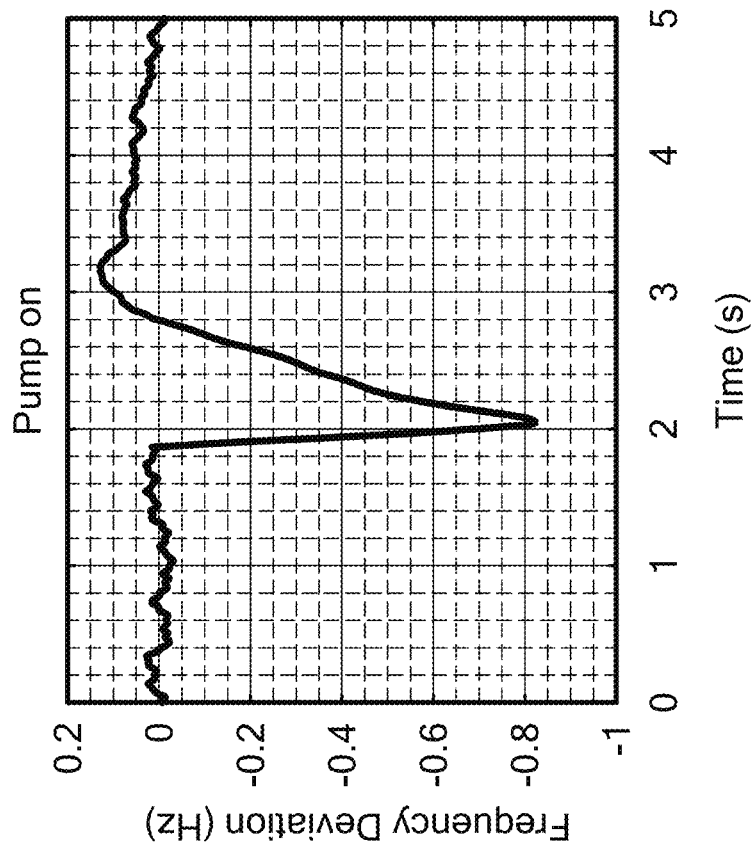
FIGS. 10 and 10A are a series of plots illustrating frequency deviation (Hz) vs. time (seconds)
Figure 10:
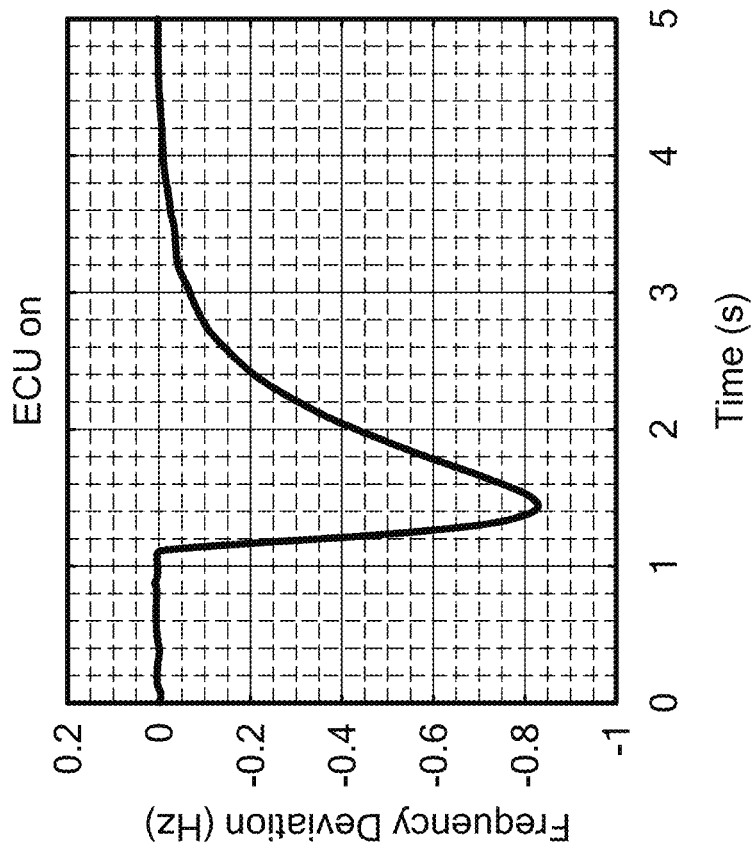

Similarly, pump turn-on events produce frequency transients easily confused with some ECU turn-on events, even though the pump consumes less than half the steady-state power of an ECU heater. However, due to its sizable inrush current, it still creates a frequency deviation of comparable size as shown in FIGS. 10 and 10A.

When considering these frequency transients as event signatures, they cannot, alone, provide unambiguous indication of each electrical event type on the microgrid. While frequency transients provide strong indications of all ECU event types, under some conditions ECU turn-on event signatures can be very similar to generator turn-off events or latrine pump turn-on events. Further, the frequency signatures corresponding to generator turn-on events and those corresponding to generator turnoff events under low base loads are only weak indicators of these events. Therefore, at least one additional event signature stream must be observed for unambiguous electrical event monitoring.

The in-phase seventh harmonic voltage content, i.e., $V_{7,r}[m]=\text{Re}\{V_7[m]\}$, was found to be particularly useful in resolving the ambiguities left by the frequency transients. As described in FIG. 3, examining both streams (frequency and seventh harmonic voltage) together permits unambiguous electrical event identification of grid coupled loads. As noted above, more generally, the techniques described herein utilize combinations of harmonic and frequency streams to provide unique identification of key loads on grids including but not limited to microgrids.

Figure 11:
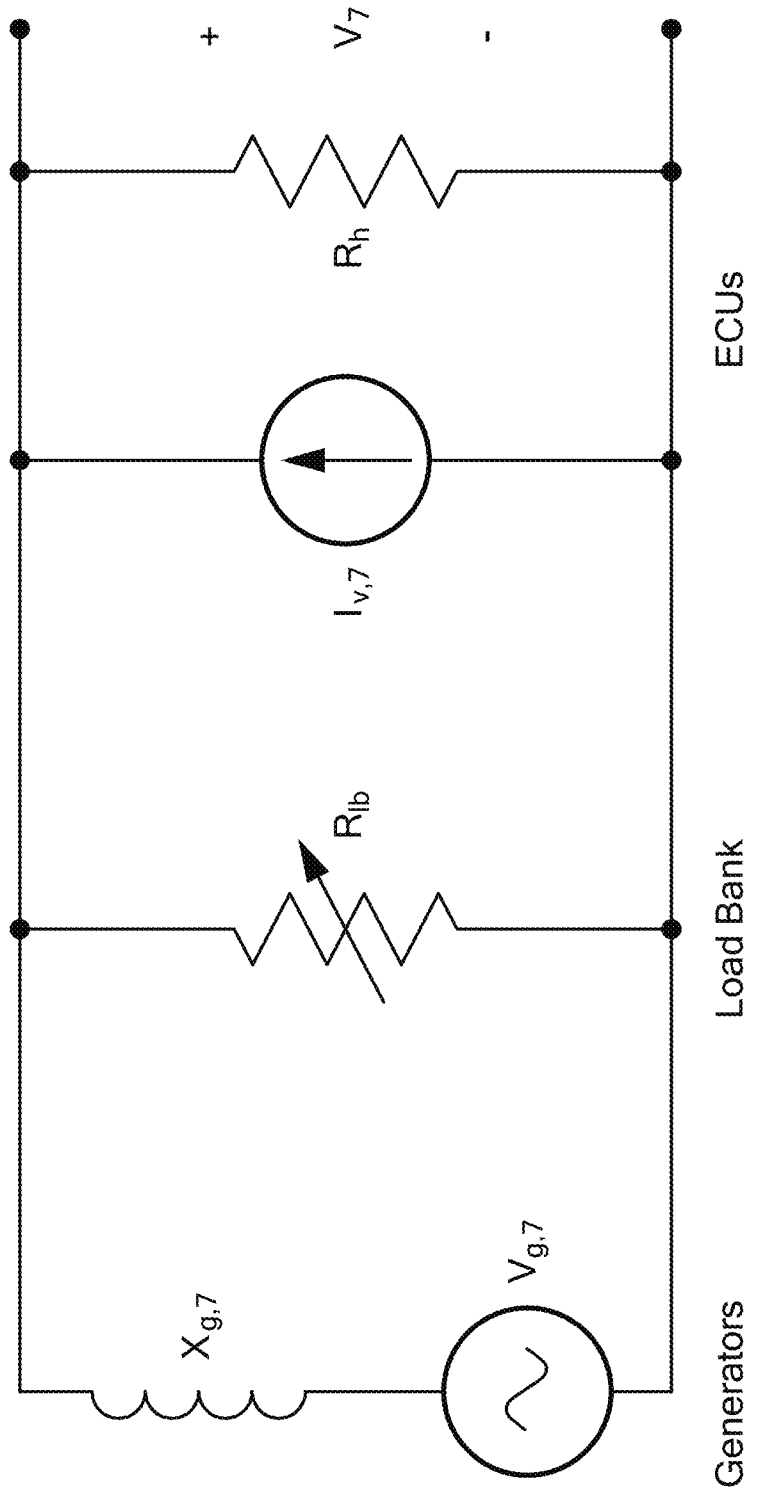
FIG. 11. is a schematic diagram of an approximate seventh harmonic circuit model for a microgrid which may be the same as or similar to the microgrid of FIG. 5.

Referring now to FIG. 11, show is an approximate seventh harmonic circuit model for the microgrid of FIG. 5 that is useful for understanding the effects of electrical events on the grid's seventh harmonic content. Here, line impedances are ignored as load and generator turn-on and turn-off events were found to be reasonably uniform across all measurement points. Variable resistor $R_{lb}$ represents the controllable load bank, and all ECU heater impedances and seventh harmonic current injections are lumped into $R_h$ and $I_{v,7}$, respectively. $I_{v,7}$ is the sum of all the ECU ventilation fan seventh harmonic currents, and $R_h$ varies with the number of energized ECU heaters such that, $$R_h = \left(\frac{s_1}{R_{h1}} + \frac{s_2}{R_{h2}} + \frac{s_3}{R_{h3}} + \frac{s_4}{R_{h4}}\right)^{-1}. \tag{6}$$

Here, $s_n$ is a binary variable equal to one when the $n^{th}$ ECU heater is energized and zero when it is not.

$V_{g,7}$ represents the combined seventh harmonic voltage of the two generators, and $X_{g,7}$ represents their combined reactance at 420 Hz (seventh harmonic of 60 Hz). With the two generators essentially identical, their combined source characteristics can be described as, $$V_{g,7}(P_L, n_g) = V_{g1,7}\left(\frac{P_L}{n_g P_{g,r}}\right) \tag{7}$$

and $$X_{g,7}(n_g) = \frac{X_{g1,7}}{n_g}. \tag{8}$$

Here, $V_{g1,7}$ ($\gamma$) is the seventh harmonic voltage of a single generator under the per generator normalized load (percent capacity), $$\gamma = \frac{P_L}{n_g P_{g,r}}, \tag{9}$$

where $P_L$ is the total fundamental power provided to the grid by $n_g$ generators each with a capacity rating of $P_{g,r}$ (60 kW).

Similarly, $X_{g1,7}$ is the output reactance of a single generator.

The combined contribution of these two bulk sources to the seventh harmonic voltage at each heater is, $$V_7 = \left(\frac{R_{lb}\|R_h}{jX_{g,7} + R_{lb}\|R_h}\right)V_{g,7} + (R_{lb}\|R_h\|jX_{g,7})I_{v,7}, \quad (10)$$

where the k operator indicates the parallel combination of two impedances. In the illustrative system, $X_{g,7} \ll R_{lb}\|R_h$. This is likely to also be true for most practical grids as generator reactance characteristics at 60 Hz need to be negligible to avoid significant voltage droop in the system. With this the case, the seventh harmonic voltage at each heater can be approximated as, $$V_7 \approx V_{g,7} + jX_{g,7}I_{v,7} \quad (11)$$

That is, the seventh harmonic voltage measurements at each ECU depend upon both the seventh harmonic voltage distortion of the generators and the seventh harmonic currents injected by the three-phase rectifiers of ECU ventilation fans. Notably, $X_{g,7}$ does not significantly affect the generators' seventh harmonic voltage distortion contributions. Further, $V_{g,7}$ is a function of normalized load when combining equations (7) and (9). These relationships were confirmed through steady-state tests with all ECU ventilation fans off so as to eliminate the contribution of $I_{v,7}$.

Figure 12:
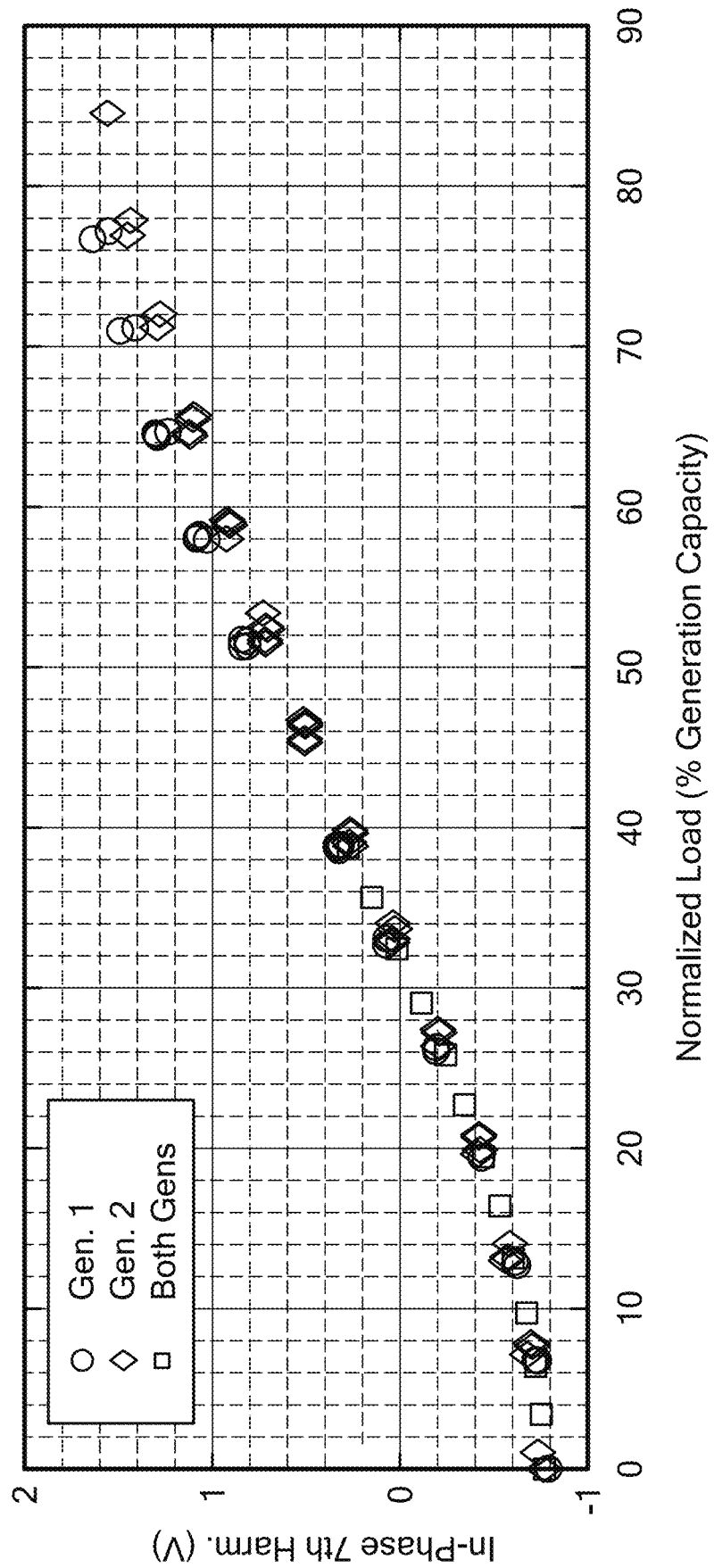
FIG. 12 is a plot of an in-phase $7^{th}$ harmonic (volts) vs. normalized load.

Referring now to FIG. 12, a plot of in-phase $7^{th}$ harmonic ($V_{7,r}$) vs. normalized load (γ), illustrates a monotonically increasing function of the normalized load, γ. Both generators produce similar levels of seventh harmonic distortion, as does their parallel combination, even though $X_{g,7}$ decreases when the two are paralleled.

Figure 13:
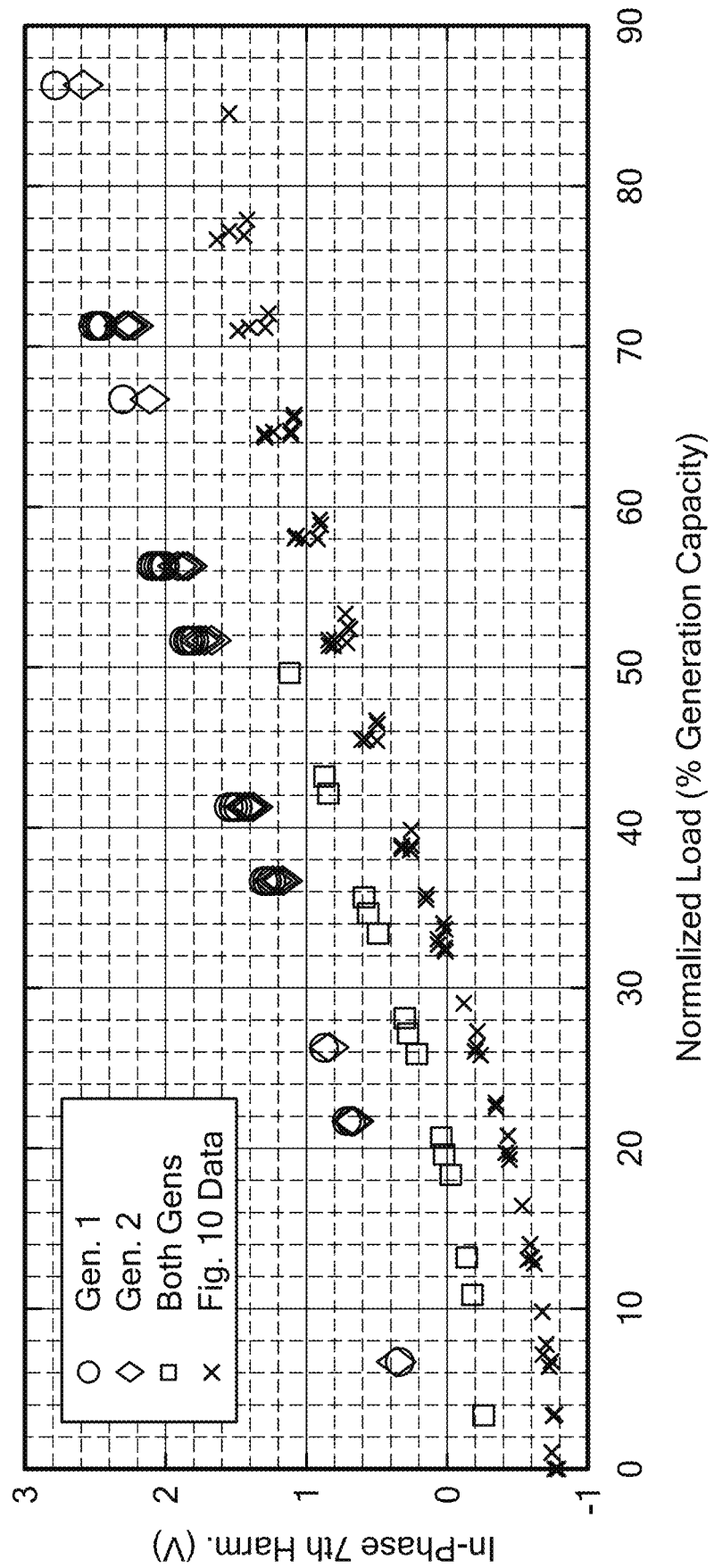
FIG. 13 is a plot of an in-phase $7^{th}$ harmonic values (volts) vs. normalized load.

Referring now to FIG. 13, when the ventilation fans are operating, their seventh harmonic currents $I_{v,7}$ interact with the generator reactance characteristics to shift the in-phase seventh harmonic voltages measured at the ECUs as shown in FIG. 13. Here, all data points from FIG. 12 are repeated for reference. This shift is more pronounced when only one generator is operating as $X_{g,7}$ is twice as large compared to when both generators operate (assuming the generators are identical). It should be noted that $I_{v,7}$ varies in time as the ventilation needs of each tent dictates fan speed, and so the $I_{v,7}$ contribution to $V_7$ is not necessarily constant. However, these variations generally occur slowly compared to the abrupt changes in $V_{g,7}$ accompanying the steps in $P_L$ caused by a load turn-on or turn-off event.

This seventh harmonic voltage relationship with normalized load resolves the ambiguities leftover from the frequency signatures. Specifically, generator turn-on events ($n_g$ increases by one), which only create small frequency transients, generate large step-down transients in $V_{7,r}$ due to the corresponding decreases in $X_{g,7}$ and γ ((8) and (9), respectively).

In FIG. 13, this is both a shift down from single generator to two generator data and a shift left in normalized load further decreasing the in-phase seventh harmonic voltage. Conversely, generator turn-off events generate large step-up transients in $V_{7,r}$.

Figures 14, 14A, 14B:
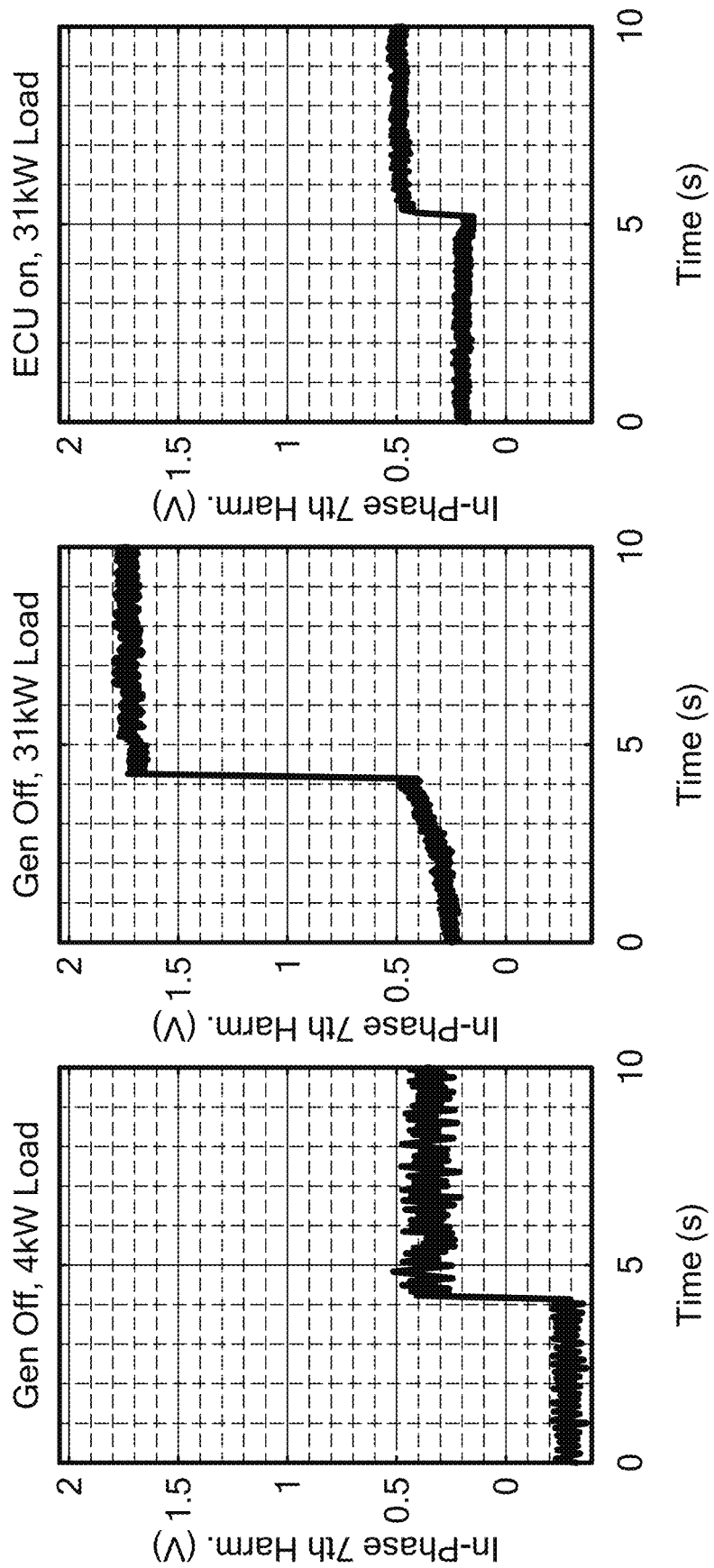
FIGS. 14-14B are a series of plots illustrating in-phase $7^{th}$ harmonic values (volts) vs. time (seconds)

FIGS. 14-14B provides example $V_{7,r}$ signatures corresponding to the same generator turn-off events of FIGS. 9-9B. Notably, the voltage transient in FIG. 14 corresponding to a generator turn-off at low load provides a clear event signature whereas the frequency transient did not. Further, the size of the $V_{7,r}$ generator turn-off transient in FIG. 14A is easily distinguishable from the ECU turn-on event transient of the right plot, while the two corresponding frequency transients are easily confused.

Figures 15, 15A:
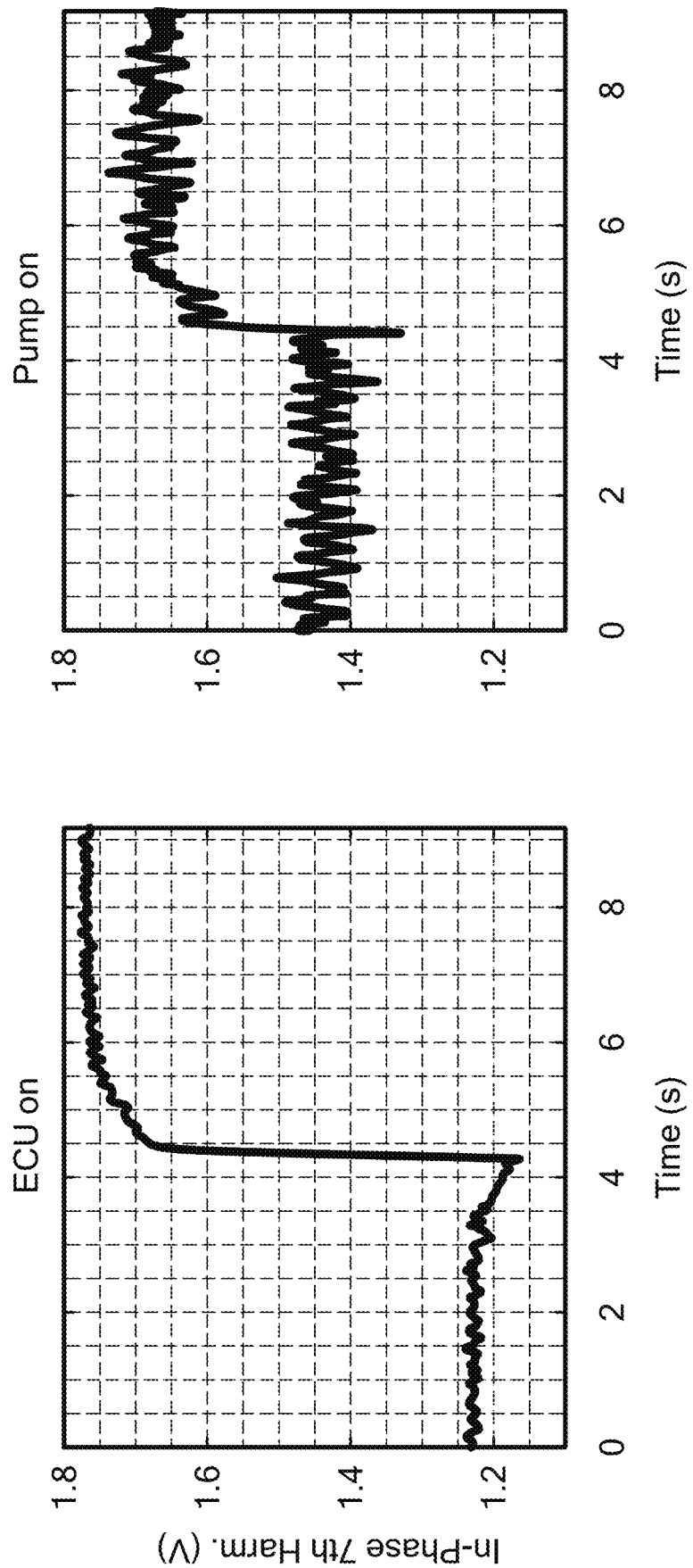
FIGS. 15 and 15A are a series of plots illustrating in-phase $7^{th}$ harmonic values (volts) vs. time (seconds)

Similarly, FIGS. 15 and 15A reveal that the $V_{7,r}$ steps corresponding to the frequency transients of FIGS. 10 and 10A help to distinguish between an ECU turn-on and pump turn-on, as the size of these steps is dictated by the steady-state power demand of the loads rather than the in-rush power.

When considered together, frequency and in-phase seventh harmonic voltage streams provide detectable and distinct transients that indicate four important microgrid events: ECU heater on, ECU heater off, Generator on, and Generator off. To automate this detection process, a correlation-based transient identification technique is used. The correlation-based transient identification technique uses "fingerprint" exemplars, i.e. representative transient signatures, to identify events.

To generate signature exemplars, a set of 512 ECU events and 15 generator events, each consisting of 1601 m-samples (approx. 13.3 s) of frequency and 7th-harmonic data containing each stream's transient were labelled. From this set of labeled data, 268 ECU events and 11 generator events were selected to create event exemplars "fused" from similarly shaped transient in this training set. Creating these exemplars allows the use of correlation methods for transient identification while limiting the number of exemplar waveforms to match against.

Figure 16:
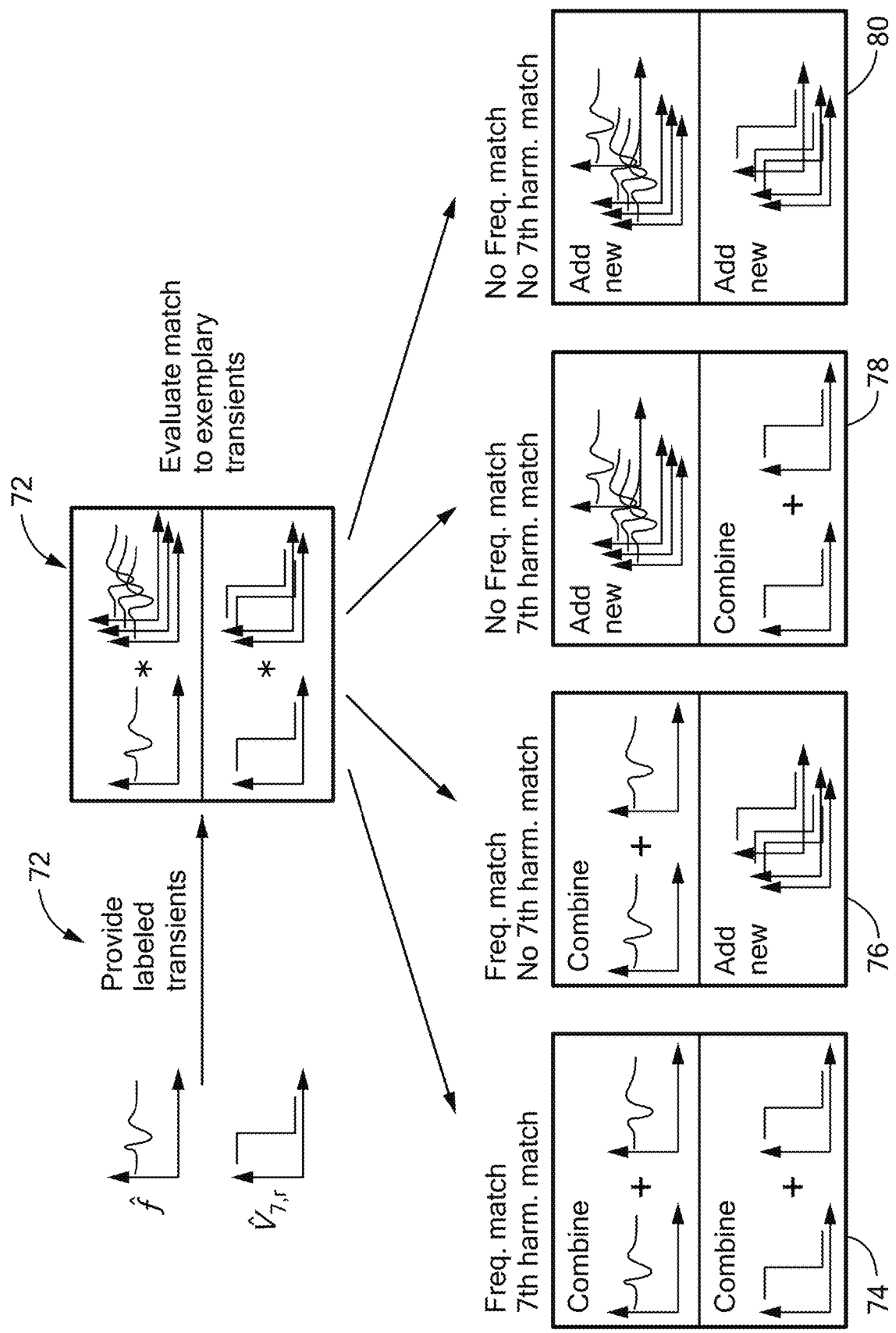
FIG. 16 is a diagram illustrating an exemplar management process.

FIG. 16 illustrates the exemplar formulation process. As shown at 72, The exemplar creation technique receives a transient signature set labeled with the event that caused it, the number of dispatched generators leading up to the event, and the base load at which it occurred. For each of the two streams that comprise the transient signature, the exemplar formulation process assesses whether the transient matches with any previously generated exemplar for that event type, number of generators, and base load (72). This matching is determined by first aligning the transient signature, y[m], with the exemplar, x[m], by index-shifting the transient by $I_o$ indices where:

$$I_o = \operatorname*{argmax}_l \sum x[m]y[m+l]. \quad (12)$$

Here, $I_o$ is the lag corresponding to the maximum in the cross-correlation of the two waveforms. The match is then scored as, $$S = \frac{\sum (x[m] - y[m+I_o])^2}{\sum x[m]^2} \quad (13)$$

i.e., the squared "distance" between the transient candidate and the exemplar normalized to the energy of the exemplar.

The lower the value of S, the better the match between the two signals. As such, a threshold level may be set below which the signals may be categorized as matching. In embodiments, the threshold level may be set empirically.

For all seventh-harmonic transients corresponding to any event type, and all frequency transients corresponding to ECU on-events and both ECU and generator off-events, this threshold was set to $S_o=0.2$. For generator turn-on events, where the frequency transients are less distinct, this threshold was $S_o$=0.45. If the algorithm determines that the transient matches the exemplar, it recursively updates the exemplar as, $$x[m]=\alpha x[m]+(1-\alpha)y[m+I_o]. \quad (14)$$

In one illustrative embodiment. the recursive update factor, $\alpha$, is set to 0.8.

Each of the two stream's transients of each event are evaluated independently, meaning they can both match their exemplar and be combined as illustrated in block 74 of FIG. 16, one can match and be combined (blocks 76, 78 of FIG. 16), or neither match (block 80 of FIG. 16). When a transient does not match a previous exemplar or no previous exemplar exists, the technique sets the transient as a new exemplar. Some events, e.g., a generator turn-off under low loading (FIGS. 9-9B), do not create significant transients in the frequency stream. For these events, only the seventh-harmonic transient is used in exemplar creation. Using this technique reduces the number of total frequency and in-phase seventh harmonic exemplars from 279 of each to 56 and 64, respectively.

With these exemplars, one can identify (i.e. on-line transient detection) "fresh" transient events by first detecting potential events in the frequency and seventh harmonic streams and then matching them against the created exemplars.

In one embodiment, the rate of event generation and the homogeneity of the large ECU loads allows a change-of-mean detector to perform well as a transient detector, although other choices are possible. In the frequency stream, the detector classifies a deviation exceeding 200 MHz for more than 4 ms, or by more than 10 MHz for more than 2 s, as a potential transient. These criteria were chosen based on the observed noise variance and the magnitudes of the frequency transients caused by events of interest.

In the seventh harmonic stream, an edge corresponding to a step greater than 0.1V is considered a transient for the loads. To detect an edge, in one example embodiment, the transient detection algorithm smooths the $V_{7,r}[m]$ stream using a filter (e.g. a low pass filter such as a Gaussian low-pass filter with a standard deviation of 0.3 s), and then evaluates the first difference of the result, s[m], as, $$d[m] = \frac{s[m] - s[m-1]}{t_z[m] - t_z[m-1]}. \quad (15)$$

A local maximum in d[m] exceeding three times its standard deviation evaluated across the exemplar window is empirically set to indicate an edge. The identification process then assesses the step size by averaging the values of $V_{7,r}[m]$ for 1.5 s before and after the detected edge, and classifies the step as a transient if the difference of these averages exceeds the 0.1V change in magnitude cutoff.

Once an event is confirmed, the identification technique compares the measured transient to all event exemplars corresponding to the estimated generator configuration and base load. This estimation is based on previously identified transients and/or the level of $V_{7,r}$ (FIGS. 12 and 13).

Figure 17:
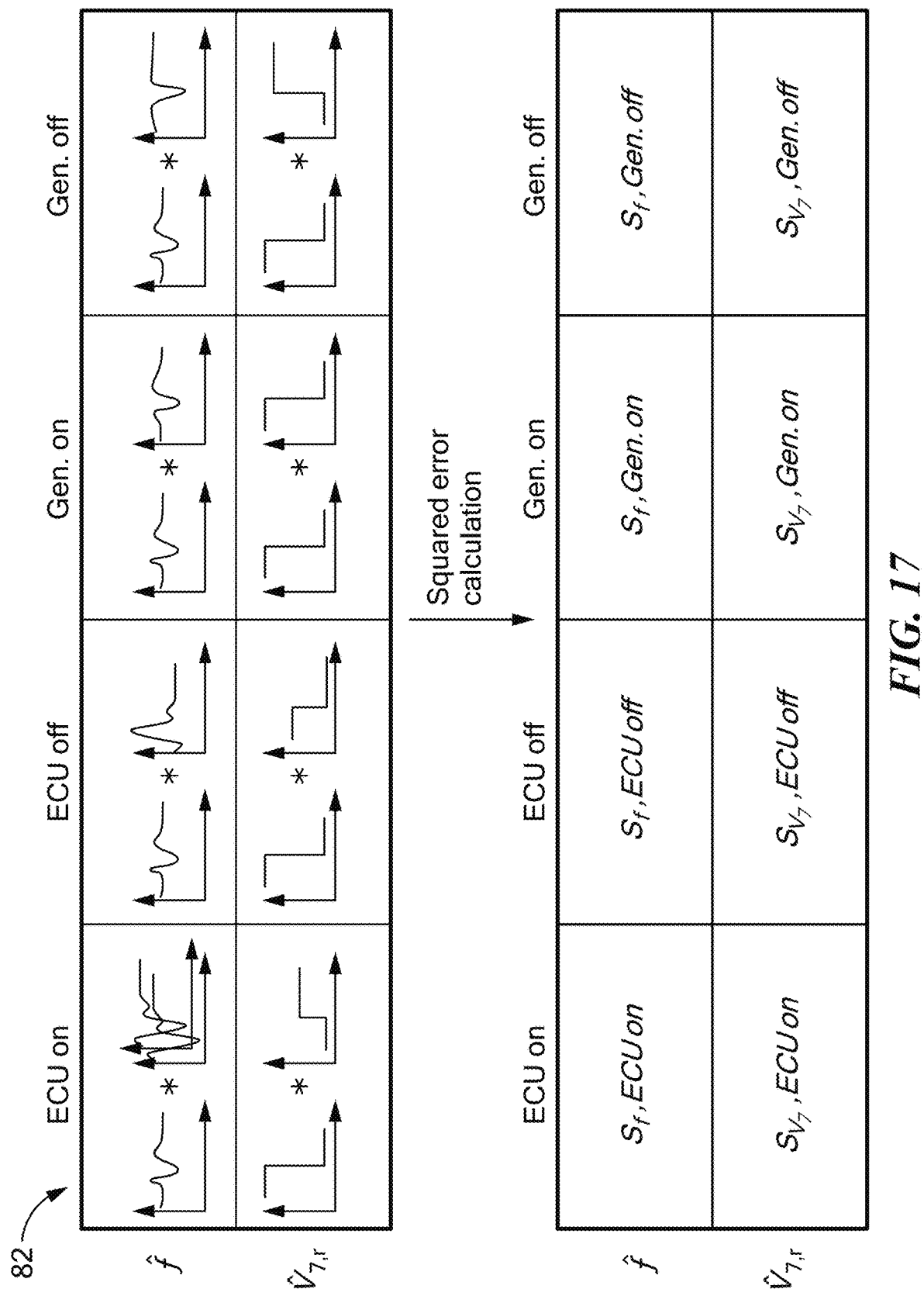
FIG. 17 is a bock diagram illustrating a matching technique for transient identification.

This matching technique, illustrated in FIG. 17, follows a process which may be the same as or similar to that used in exemplar creation and may use the same threshold values.

Measured transients are compared with the exemplar transients of each event type. As depicted in the ECU turn-on event category (block 82 in FIG. 17), event types may contain multiple exemplars for one or both of the two streams. In these instances, the match score of the measured transient may be calculated or otherwise determined for each exemplary transient and the score indicating the best match is taken. In the case of a generator turn-off under low loading conditions, there is no frequency exemplar to compare against, and the frequency transient score is instead determined as the scaled RMS value of its deviation, $$S = \sqrt{\frac{\sum \Delta \hat{f}[m]^2}{E_o}} S_o. \quad (16)$$

Here, $E_o$=2.4, which is the signal energy of a frequency deviation of 10 MHz for 2 seconds (240 m-samples), i.e., the larger energy value of the frequency transient detection thresholds described in the transient detection section. $S_o$ is set to 0.2, the matching threshold for generator turn-off frequency transients. If these match scores are below the threshold values for both the frequency and seventh harmonic streams of a particular event type, the transient is identified as occurring due to that event type. If no event is identified after this process, the detected transient is deemed due to a non-ECU or generator event and is ignored.

Simultaneous or near-simultaneous events create "collision transients." Collision transients can be caused by the actions of any device, including ECUs, generators, or pumps. They are not in general repeatable or distinct because the exact timing of the events that cause them to have a large effect on the conglomerate shape and extent of the transient. Collision transients, while rare, are therefore currently unidentifiable. It is noted that reconciling simultaneous events could be important, and point to two possibilities for maintaining situational awareness in the presence of collision transients. First, the "collision" may be resolvable as the sum of known exemplars. Second, it may not be necessary to resolve the exact details of the collision. For an autonomous ECU control algorithm, it may be sufficient to know that a collision has occurred, and develop a set of operating rules for resolving and moving past the collision with individual control efforts.

Next described are Autonomous "Self-Driving" Electrical Loads, also referred to herein simply as "autonomous loads."

After reading the disclosure provided herein, it is understood by one of ordinary skill in the art that the systems, and techniques described herein are applicable to residential, commercial, and industrial sections of a conventional utility, particularly a subsection such as that fed by a distribution transformer. It is further understood by one of ordinary skill in the art that, although a particular form of information network is described hereinbelow, such description is made simply for the purpose of providing clarity to the broad concepts sought to be protected and that any information network can be used to exchange load operation information, including the internet, wireless signals, power line carrier signals, dedicated communication networks of many well-known types, and so forth.

Furthermore, in the illustrative embodiments described herein, the "dual-use" of power wiring to convey both power and information through power quality or voltage waveform distortions is demonstrated. These voltage waveform distortions will be available on a microgrid, but could also be examined on sections of any power utility, including on residential, commercial, and industrial power systems, grids on ships, aircraft, transportation systems, and so on. The approach here can be applied to both AC and DC utilities.

Figure 18:
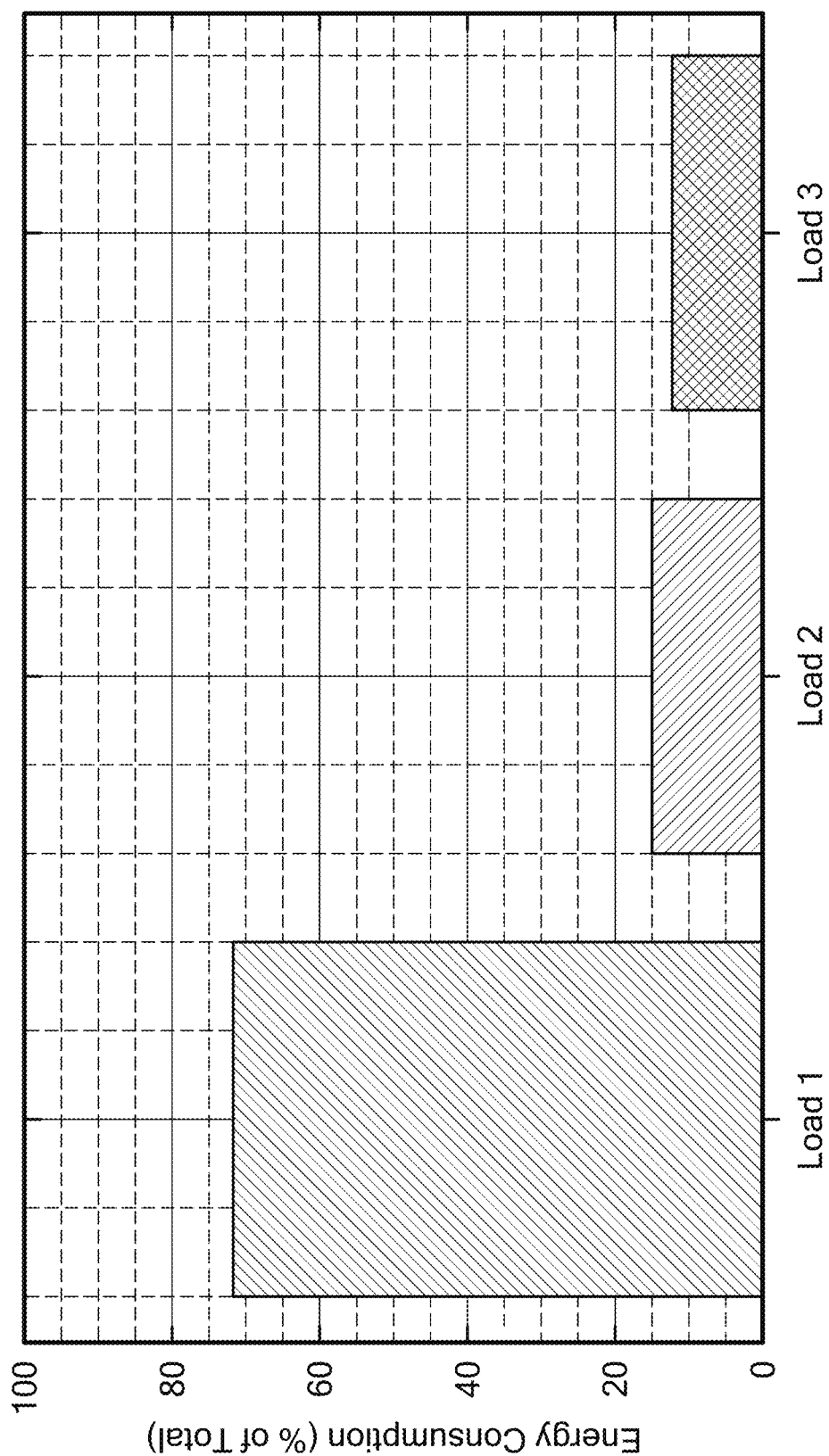
FIG. 18 is a bar chart illustrating energy consumption as a percent of total energy consumption for three different loads.

Referring now to FIG. 18, shown is a pot of energy consumption for an illustrative system which may be the same as or similar to one of the systems described above in conjunction with FIGS. 1, 4 and 5. For purposes of illustration, the electrical demand of the system is characterized by three loads. For example, load 1 may correspond to a heating system, load 2 may correspond to a ventilation system and load 3 may represent the collective energy consumption of the remainder of the electrical loads in the system. As may be expected, in cold weather, the system energy demand is dominated by the load 1 (i.e. heaters). As shown in FIG. 18, in this illustrative embodiment, during heating operation, the heaters account for over 70% of the total base load. It should, of course, be appreciated that under other environmental conditions, the system energy demand may be dominated by a different load. For example, in cases of extreme heat, the system energy demand may be dominated by high voltage air conditioning (HVAC) components.

Figure 19:
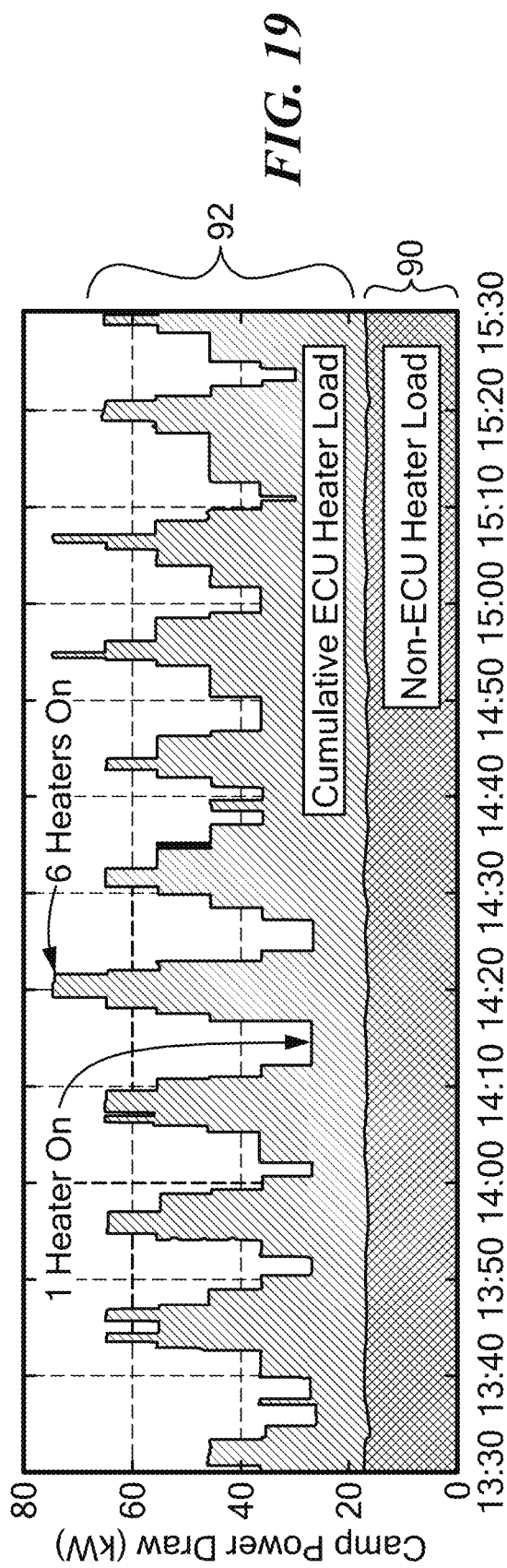
FIG. 19 is a plot of system power draw (kW) vs. time (minutes)

Given the example scenario of FIG. 18 and referring now to FIG. 19, shown is a plot which illustrates system power draw vs. time. Observation of this plot reveals the opportunity to reduce energy expenditures of the system through autonomous load coordination. FIG. 19 shows the power draw of the system over a two hour window. Region 90 represents the total non-heater load, while region 92 represents the cumulative heater load. As can be seen from FIG. 19, during this two hour time period, the non-ECU heater load was stable, but the cumulative heater load varied significantly and often as the number of simultaneously operating heaters varied. The average total load during this period was 44 kW compared to the peak load over 70 kW.

These peaks are caused by the conventional thermostatic control employed by the heaters to regulate system temperatures.

In response to the system reaching a first system temperature threshold, each heater deactivates (i.e. turns off). With the heater off, the system temperature may decrease until reaching a second system temperature threshold. In embodiments, the first system temperature threshold corresponds to a temperature which is higher than the second system temperature threshold. For example, the first system temperature threshold may correspond to a relatively high system temperature and the second system temperature threshold may correspond to a relatively low system temperature. When the system temperature reaches the second system temperature threshold, the heater re-activates (i.e. turns on and thus generates heat).

Thus, the above-described system operation is similar to the behavior in most residential or commercial venues, in that the heaters and associated heater control systems receive no coordination. Rather, the heaters (and associated heater control systems) simply respond to temperature conditions in the structure that they serve. The "random" timing of each heater activations leads to a sliding phase of operation with respect to other heaters in the system. With such lack of coordination, the possibility exists that periodically, many heaters (and possibly all heaters) will be "on" at the same time, putting a maximum demand on the grid (which may be a microgrid) from which the heaters draw power.

Figure 19A:
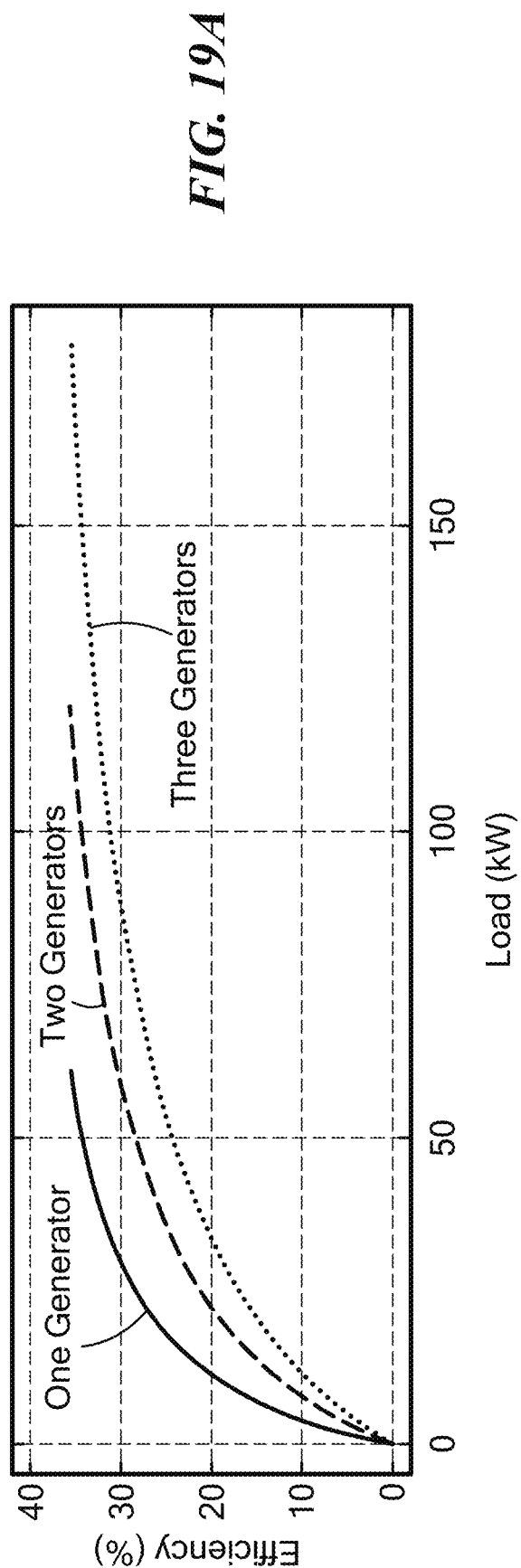
FIG. 19A is a plot of efficiency (%) vs. load (kW) for the system power draw of shown in FIG. 19 for one, two and three generator systems.

As shown in FIG. 19A, this operating profile is unfortunate and unnecessary as it may require multiple power sources (e.g. multiple generators) to support the grid where if coordination were used fewer power sources (e.g. even a single power source such as a single generator) could be used. Thus, lack of coordination results in less efficiency. For example, if the power sources are generators which operate on fuel (e.g. an oil-based fuel such as gasoline or diesel fuel), lack of coordination between loads may results in less efficient fuel use.

Except under the most extreme environmental conditions, no environmental control system (e.g. a heating system or an HVAC cooling system) needs to operate continuously without pause. The operation of multiple environmental control systems could instead be interleaved to reduce (and ideally minimize) peak demand while maintaining occupant comfort.

In accordance with the concepts described herein a coordinated control approach could be used to make systems more efficient while maintaining occupant comfort. For example, in the illustrative scenario described in conjunction with FIG. 19, no more than three out of four heaters (e.g. loads 52*a*-52*d* in FIG. 5) need operate simultaneously. In this example, the use of coordinated control would reduce the aggregate load such that the load could be met by a single power source (e.g. a single generator) resulting in an efficiency improvement of about 18%.

Using such a control technique an electrical utility or other operator could specify a maximum number of loads (e.g. active ECUs), that could be operated during a given operating window of time for the utility. Well-behaved ECUs could be made aware of the operation of other ECUs and thus could wait for their turn to become operational. For example, when one ECU turns off another ECU could turn on. This approach could be used to schedule needed services (e.g. environmental services such as heating or cooling services) to operate at a proper time thereby reducing (and ideally minimizing) peak power demand in a global operating schedule without requiring any special network or specially coordinated control across the different loads (e.g. without requiring any special network or specially coordinated control across different ECUs).

In some systems, such autonomous coordination could mean the difference between running efficiently with one generator (or more generally one power source), or wasting fuel with multiple inefficiently loaded generators operating to meet occasional peak demand. On a conventional electric utility, this type of coordination across residences, for example, could mean the difference between operating or overloading a distribution transformer.

To provide autonomous loads capable of operating in accordance with the concepts of the above describe control scheme, each load may deduce information about the states of the other loads on the grid. This information could be shared by any of several networking schemes, including wired networks, wireless networks, optical networks, or power line carrier communication networks.

An alternative approach is to create awareness through the observation of the utility voltage waveform itself, with no other additional or particular information exchange. In this case, the utility may serve as both the source of power and also as a signaling network. This approach works particularly well on microgrids or sections of a conventional utility where the voltage regulation is not perfectly "stiff." Described above in conjunction with FIGS. 1-17 is an event identification technique that permits a load to nonintrusively recognize the operation of neighboring loads by identifying power quality changes in the voltage waveform shared by the loads. As described above, this event detection technique requires no special control wiring or networking.

FIGS. 20-20B depict the operation of an event identifier.

Referring now to FIG. 20, a plot which illustrates an event identifier output as it tracks the number of loads (e.g. ECU heater loads) online and the number of power sources (e.g. diesel generators) dispatched. As can be seen, with 4 on-line loads (e.g. 4 online ECUs) 2 generators are also online. However, when the number of on-line loads decreases to 3 from 4 (e.g. the number of online ECUs decrease to 3 from 4), there is no change in the number of generators which are online (i.e. 2 generators remain online).

Referring now to FIG. 20A, a plot which illustrates the frequency of a system operating with a microgrid which receives power from multiple generators at 120/208V at 60 Hz shows the frequency of the microgrid utility nominally near 60 Hz. However distinct deviations 96,98 are shown as the generators and loads (e.g. ECUs) in the system activate and deactivate. These frequency deviations occur because the generators do not have over-sized spinning energy reserves in comparison to the load requirements.

FIG. 20B shows the measured in-phase 7th harmonic content in the systems microgrid voltage. This voltage distortion is due to the power electronics of ECU fan drives and the space harmonics in the rotating machinery of the generators, and its level changes as loads and generators come on and off-line. Together, the frequency variations and changes in seventh harmonic content provide "fingerprint signatures" useful for distinguishing critical events, including the turn-on and turn-off of ECUs and the addition or removal of a generator from the generator pool.

Specifically, in FIGS. 20A and 20B, the small frequency fluctuation (FIG. 20A) and large 7th harmonic step change (FIG. 20B) at approximately 204 mins corresponds to a generator turn-off event. Later, the positive frequency spike/ small negative 7th harmonic step and negative frequency spike/small positive 7th harmonic step correspond to ECU heater turn-off and turn-on events, respectively.

Generally, the ability of a controller to recognize these signatures as identifiable events can be approached as a machine learning problem. However, given limited labelled event data, the signal-processing approach for transient recognition described above in conjunction with FIGS. 1-17 may be used. As described above, this signal-processing approach is based upon the cross-correlation between a representative event transient, (also referred to as a "representative event transient signature" or more simply as an "exemplar"), and a detected event. Under this process, an event is detected via analysis of the amplitude and time-length of frequency deviation and the amplitude in the step change in the 7th harmonic. For any system, threshold values defining an event may be empirically defined. For the example system described herein above, threshold values defining an event were empirically defined as any of the following: a frequency deviation of 200 MHz or more for longer than 4 ms, a frequency deviation of 10 MHz or more for longer than 2 s, or a 7th harmonic step change of larger than 0.1V.

Once a candidate event is identified, segments of the measured frequency and 7th harmonic data streams containing the event are compared against frequency and 7th harmonic exemplars for each of the following events, an ECU turn-on, an ECU turn-off, a generator turn-on, and a generator turn-off. This comparison is quantified with a matching score which may be defined as:

$$S = \frac{\sum_{n=0}^{N-1}(x[n]-y[n+l_o])^2}{\sum_{n=0}^{N-1}x[n]^2}. \tag{17}$$

Here, $x[n]$ is an exemplar waveform (either frequency or 7th harmonic) of sample-length N, and $y[n+l_o]$ is an equivalent-length section of the corresponding data stream sample-shifted by:

$$l_o = \underset{l}{\mathrm{argmax}} \sum x[m]y[m+l]. \tag{18}$$

Combined, Equation (18) ensures the two waveforms are time-aligned by identifying the sample-delay, $I_o$ which maximizes the correlation between the two signals, and (1) scores the extent to which the two waveforms match. A perfect score, S=0, occurs when the two signals are identical. Maximum scores are empirically defined. Below the maximum score a measured transient is deemed to match the exemplar and above the maximum score a measured transient is deemed to not match the exemplar.

In the example system described above, the maximum thresholds are set to $S_{max}=0.2$ for all seventh-harmonic transients corresponding to any event type and all frequency transients corresponding to all event types except generator turn-on events. For these, the maximum score threshold was set to $S_o=0.45$ as these frequency transients are less distinct compared to those of the other events.

Given the ability to recognize the turn-on and turn-off events of neighboring loads, as will be described in detail below, a new kind of controller (referred to herein as an autonomous load controller) can be provided to accompany each load. Such an autonomous load controller can automatically respond intelligently to the behavior of other loads in order to reduce (and ideally minimize) utility demand. The autonomous load control techniques described herein work with the above described nonintrusive event identification technique, though the autonomous load control techniques can also be used with loads that communicate by dedicated networks or any other convenient means.

Figure 21:
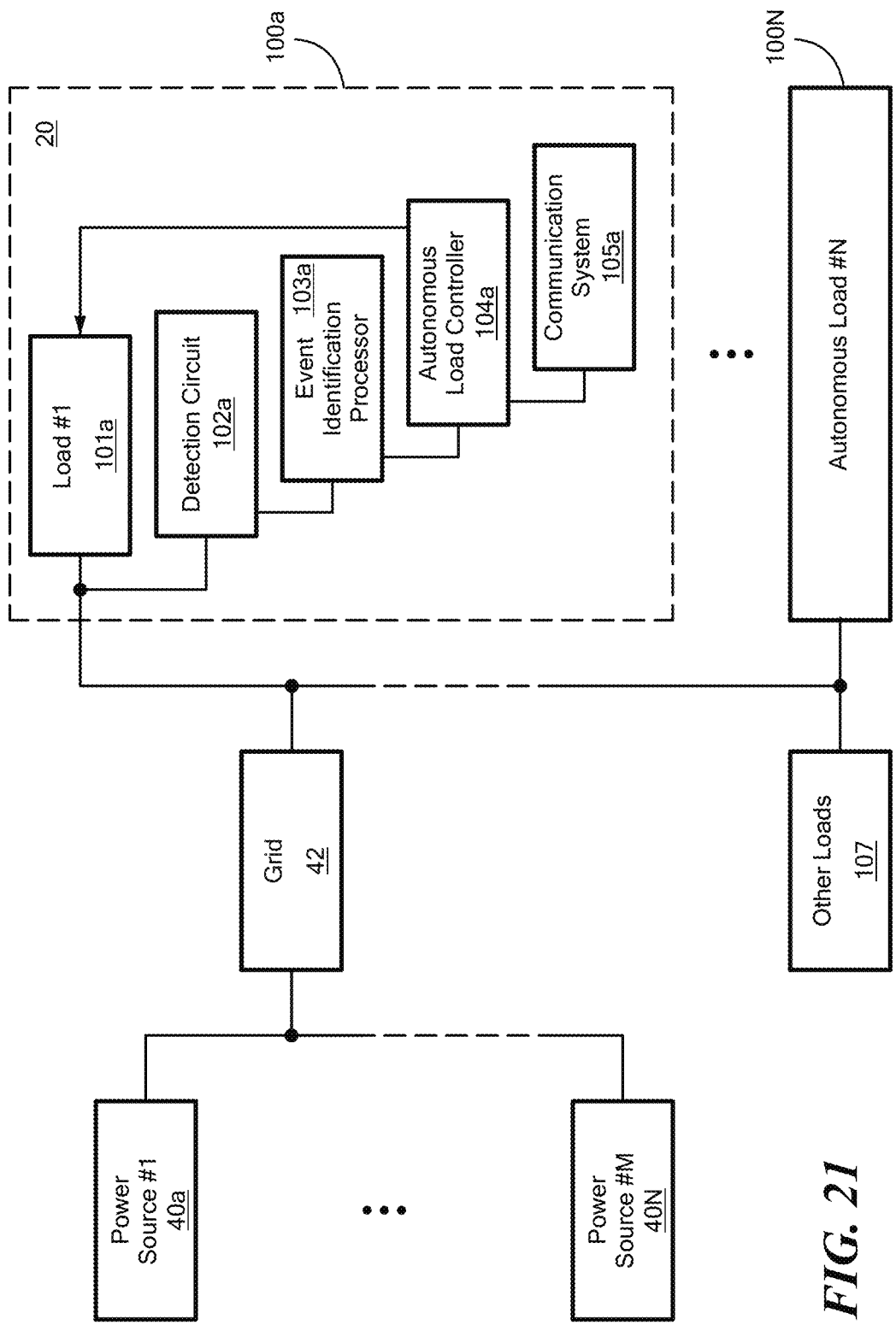
FIG. 21 is a block diagram of one or more an autonomous loads coupled to a power grid.

Referring now to FIG. 21 a system in which like elements of FIG. 4 are provided like reference designations, includes a bank of power sources which may comprise one or more power sources 40A-40N coupled to grid 42.

In this illustrative embodiment, power source bank 40 is here shown to include M generators denoted 40a-40M and thus may be referred to as a generator bank. It should, of course, be appreciated that power source bank 40 may include any number of power sources (e.g. one or more power sources) and that the power sources may be any type of electrical power source including but not limited to fuel operated generators, solar generators, wind power turbines, to name but a few different types of power sources. It should also be noted that at any point in time, one, some or all of the M power sources may act as a source of electrical power and this provide electrical provide service to grid 42. It should also be noted that grid 42 may correspond, for example, to a portion of a larger electrical grid system or may correspond to a microgrid.

Also couple to grid 42 are one or more loads including one or more autonomous loads 100a-100N (generally referred to as autonomous loads 100). Although not explicitly shown in FIG. 21, it should be appreciated that other loads (generally denoted 107) which are not autonomous loads may also be coupled to grid 42. Such loads 107 are sometimes referred to herein as unmonitored loads 107. Autonomous loads 100 and unmonitored loads 107 coupled to grid 42 are both capable of receiving power via the grid. It should be noted that at any point in time, one, some or all of the loads 100, 107 may draw power from grid 42. Load 101a may be provided, for example, as a cyclically operating load (i.e. load which sporadically or periodically draw power from the grid) and a high demand load (i.e. a load, which when operating, draws an amount of power from the grid which is relatively large compared with the amount of power being drawn by other loads on the grid or which is relatively large compared with the amount of power available from the grid).

Taking autonomous load 100a as representative of all N autonomous loads, load 101a has coupled thereto a detection circuit 102a. Detection circuit 102a may be configured to measure, sense or otherwise detect a characteristic of a signal provided to the autonomous load 100a. For example, Detection circuit 102a may be configured to measure, sense or otherwise detect a characteristic of a signal provided to load 101a (which may be one or more analog signals or one or more digital data values). In embodiments, the detection circuit is configured to measure, detect or otherwise sense one or more of: a power signal, a voltage signal or a current signal. In embodiments, the one or more signals measured, detected or otherwise sensed by the detection circuit may be one or more an analog signals, one or more digital signals or a combination of one or more analog and digital signals. In embodiments, the detection circuit may be configured to measure, detect or otherwise sense signal characteristics including but not limited to: signal frequencies and/or amplitudes; changes in signal frequencies and/or amplitudes, signal waveforms; changes in signal waveforms; power levels (e.g. minimum, average and/or peak power levels); changes in power levels; signal transients (including characteristics of amplitude and frequency transients); and/or changes in signal transients.

Detection circuit 102a is coupled to an event identification processor 103a. Event identification processor receives one or more signals (which may be one or more analog or digital signals) from detection circuit 102a and extracts and identifies a load event based upon the signal measured, sensed or otherwise detected by the detection circuit 101a.

Identification processor 103a processes the signals provided thereto to identify load operation characteristics or "signatures" one or more of the respective loads 100a-101N and 107 using any of the techniques described above in conjunction with FIGS. 1-20.

Identification processor 103a is coupled to provide information to an autonomous load controller 104a and thus processor 103a provides information to autonomous load controller 104a. Autonomous load controller 104a comprises a processor and a memory. The memory may have stored thereon information relating to various loads (e.g. either of both of any autonomous loads 100 and unmonitored loads 107 coupled to the grid) as well as information related to the grid and as well as information related to power sources coupled to the grid. In embodiments, event identification processor may update information in the memory of the autonomous load controller and the event identification processor may thus update the autonomous load controller's knowledge of the grid state. Autonomous load controller 104a utilizes the information provided there to enable autonomous control of load 100a. Thus, autonomous load controller 104a may be configured to control at least some operation of a load to which it is coupled (e.g. load 100a in the illustrative embodiment of FIG. 21). That is, autonomous load controller 104a is configured to receive load event information from the event identification processor 103a and provide a control signal to the load 100a in response to the load event information.

In embodiments, the autonomous load 100a may further comprise a communication system 105a coupled to load controller 104a. Communication system 105a operates to allow communication between at least the various autonomous loads 100a-100N and in some embodiments with other systems such as other control systems. In embodiments, communication system 105a may be implemented as power line carrier communication system, a wire-based communication system (e.g. telephone networks, or ethernet networks, and fiber-optic networks, waveguide transmission lines), or wireless communication system (e.g. a cellular transceiver or other type of transceiver for performing packet-based communication). Other forms of signaling may also be used. Thus, communication system 105a may be used for signaling or otherwise communicating with other autonomous loads or other systems such as other control systems.

In this case (i.e. when the autonomous load controller 104a is coupled to a load) the load may be referred to as an "autonomous load" 100a or as a "self-driving load" 100a (i.e. a load which utilizes signature information generated by a transient identification processors and uses the signature information to operate in accordance with an autonomous control scheme). Examples of autonomous loads will be described in detail below in conjunction with FIGS. 22-27.

As noted above in conjunction with FIG. 1, in embodiments, one or more loads 100a may be conventional electrical loads having a separate voltage detection circuit and transient identification processor coupled thereto (i.e. one or both of voltage detection circuit and transient identification processor may be separate from the load). In embodiments, one or more loads 100a may have the voltage detection circuit and transient identification processor provided as an integral part of thereof. Likewise, in embodiments, autonomous load controller 104a may be provided as an apparatus (e.g. a circuit, device or processor) which is separate from a load, the voltage detection circuit and the transient identification processor. In other embodiments, however, autonomous load controller 104a may be provided as an apparatus (e.g. a circuit, device or processor) which is integral with or provided as part of. one or more of a load, a voltage detection circuit and a transient identification processor One example of a load which may be provided with or coupled to an autonomous load controller is an environmental control system. An environmental control system which includes an autonomous load controller (sometimes referred to herein as an autonomous environmental control system) may be appropriate for use in a variety of different structures including, but not limited to, an office buildings, an residential apartment buildings, hotels, motels, single or multi-family residences or any other type of structure in which it is desired to maintain an ambient temperature at a particular temperature or within a particular range of temperatures.

Under the autonomous control technique described herein, each autonomous load controller in an autonomous environmental control system may constantly or periodically monitor the temperature of the structure with which it is associated (e.g. the temperature of the structure and/or its local voltage, processing the latter for frequency and 7th harmonic data streams). Both the temperature and voltage quality information can "trigger" one or more interrupt service routines (ISRs) or other type of processing, which updates the autonomous load controller knowledge (and thus also necessarily updates the autonomous load knowledge of the grid state and/or cause the load (e.g. a heater) to change states.

This, autonomous loads 100a-100N are capable of changing their respective operating states in response to load event information. For example, in response to receiving load event information which indicates that another load coupled to the same electrical grid as the autonomous load has changed its state (e.g. the other load has turned on, turned, off, slowed down, sped up, is drawing more or less power from a grid, etc. . . . ) the autonomous load can change its state accordingly. For example, in response to an autonomous load receiving load event information which indicates that another load has changed its state from off to on, the autonomous load may change its state from on to off. In this example, the autonomous load may change its state to off to prevent drawing more power than can be sourced by the electrical grid to which both loads are coupled.

It should be appreciated that in embodiments detection circuit 102a may be provided as a voltage detection circuit which may be the same as or similar to voltage detection circuit 46a described above in conjunction with FIG. 4. Similarly, event identification processor 103a may be provided as a transient identification processor 48a which may be the same as or similar to transient identification processor 48a described above in conjunction with FIG. 4. Thus, in embodiments, processor 103a may provide transient-related information to autonomous load controller 104a which enable autonomous control of load 100a. Thus, autonomous load controller 104a may be configured to control at least some operation of a load (e.g. load 100a) to which it is coupled.

Figure 22:
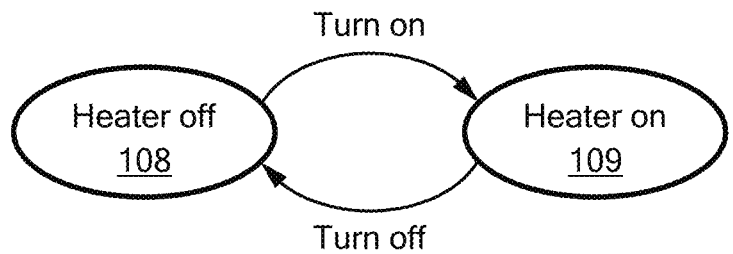
FIG. 22 is a state diagram of an example heater.

Referring now to FIG. 22, for illustrative purposes, a state diagram of an example load corresponding to a heater is shown. Under traditional thermostatic control, the heater only changes states in response to the temperature of a system (or a physical space) which it is heating. Specifically, when off (i.e. when in state 108), the heater will turn on only when the temperature inside the system decreases below a lower temperature threshold, $T_l$, and when on (i.e. when in state 109), the heater will only turn off when the temperature rises above an upper threshold, $T_h$. While simple and robust, this type of control creates the large aggregate demand peaks depicted in FIG. 19, which can lead to inefficiencies and excess strain on grid distribution equipment.

It should be noted that autonomous loads may be described as having a self-distributing characteristic. That is, autonomous loads have information (or have access to information) concerning their own state as well as the states of one or more other loads coupled to the grid 42 (e.g. one or all of autonomous loads 100 or unmonitored loads 102) or information concerning grid 42, and are configured to operate in a manner which is beneficial to the overall system such as the example system illustrated in FIG. 21 (i.e. an autonomous load is aware and responsive to the aware signal to reduce, or ideally minimize, aggregate peaks in an electrical power system). For example autonomous loads may be configured to avoid peaks or stated differently, the autonomous loads may "self-distribute" their loads (e.g., automatically change the amount of power they draw from the grid) to avoid peaks. As explained above, the may be accomplished, for example by one or more autonomous loads automatically turning on or off). Thus, an autonomous heater as described in FIG. 22, for example, can maintain the temperature responsiveness of a traditional thermostatic control, but also improves the collective behavior of other loads coupled to the grid by limiting the number of simultaneously operating heaters. This is accomplished via the use of an autonomous load control technique.

Using a heater comprising an autonomous load controller as an example of an autonomous load, Table I lists processes (e.g. interrupt routines) for each heater state, in order of "precedence," along with the trigger event that causes their operation.

TABLE I

| State | Interrupt Service Routine | Trigger |
|---|---|---|
| Heater off | 1. Transient identification | Transient event detected |
|  | 2. Under-temperature | $T_t < T_l$ |
| Heater on | 1. Transient identification | Transient event detected |
|  | 2. Over-temperature/ Overlength | $T_t > T_h$ OR $t_{on} > t_{on,max}$ |

Notably, in both states 108, 109 (i.e. both the heater on and heater off states), the transient identification routine takes precedence over the temperature-based routines. That is, if a transient event is detected (triggered) while the heater autonomous load controller is executing a temperature-based routine, the autonomous load controller will abort the temperature-based routine and execute the transient identification routine before reinitiating the temperature-based routine.

Next described are example temperature based routines.

Figure 23:
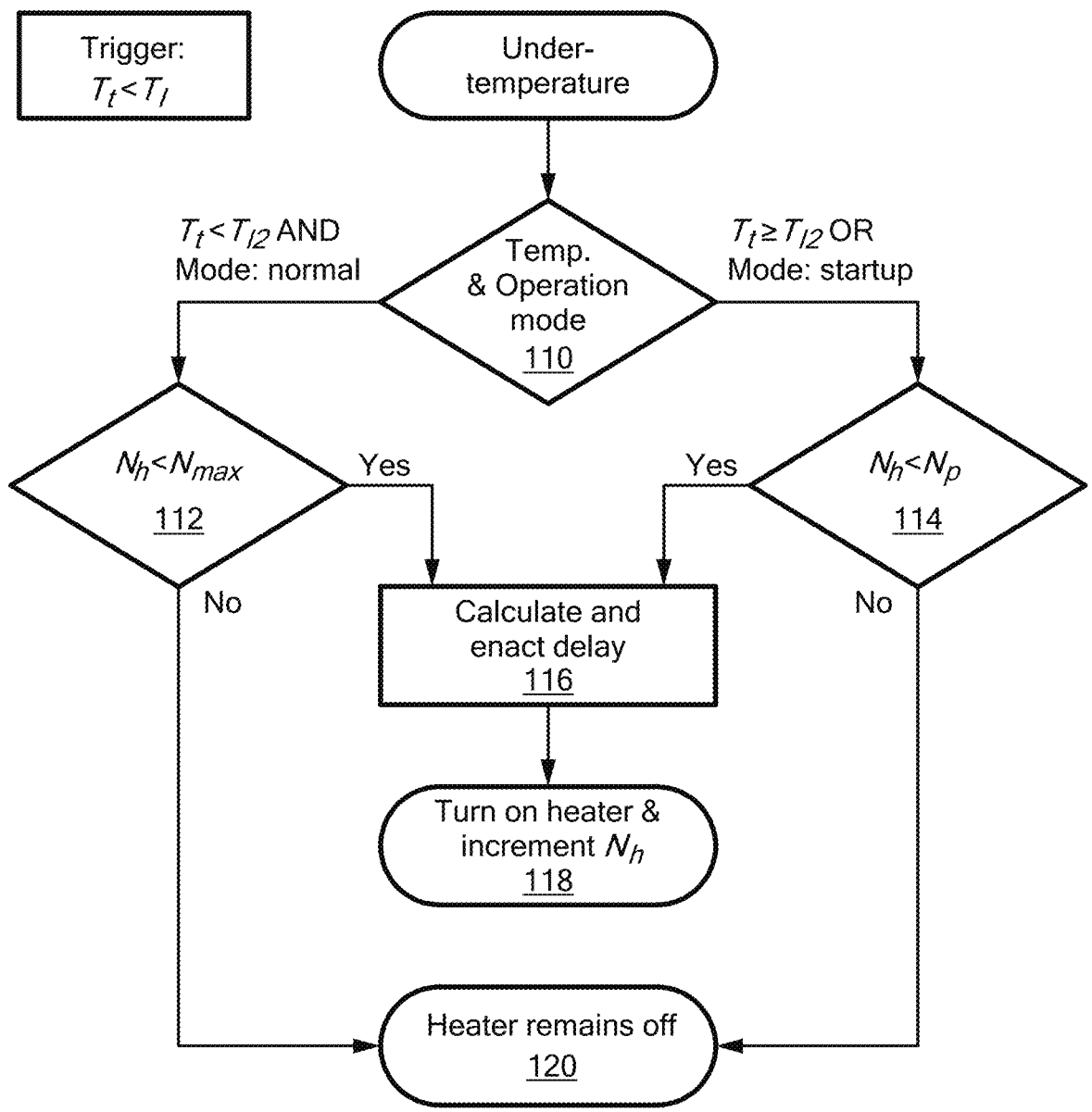
FIG. 23 is a flow diagram of an illustrative under-temperature process for a heater having a state diagram as shown in FIG. 22.

Referring now to FIG. 23, and considering first an under-temperature process (which may be implemented as an ISR, for example) FIG. 23 depicts an illustrative operational process for an under-temperature routine which triggers when $T_t < T_l$, where $T_t$ is the system temperature (e.g. the temperature of a room) and $T_l$ is the lower temperature threshold. However, unlike traditional thermostatic control, this condition alone only initiates the routine rather than ensures the heater turns on.

Under the autonomous control scheme, as shown in decision block 110, the autonomous load controller considers the operation mode of the heater. In this example, the two operating modes of the heater are startup, i.e., when the heater is first turned on to regulate the temperature of a space or structure to which the heater is exposed (in contrast to the operation state of a heater heating element, for example), and normal operation, which the heater switches to after first eclipsing the lower temperature threshold, $T_{l2}$.

If in decision block 110, a decision is made that the system is operating in normal mode or the temperature being controlled (e.g. a room temperature) has dropped below a second, lower threshold temperature ($T_{l2}$) where $T_t < T_{l2}$ then processing proceeds to decision block 112.

If in decision block 112 a decision is made that the number of other heaters in their on state, $N_h$, is less than a maximum number, $N_{max}$, then processing proceeds to processing blocks 116, 118 and the heater can turn on following a delay (116). If in decision block 112 a decision is made that the number of other heaters in their on state, $N_h$, is greater than a maximum number, $N_{max}$, then processing proceeds to processing block 120 and the heater remains off. Thus, the heater can turn on so long as doing so will not cause the total number of "on" heaters to exceed a maximum number, $N_{max}$.

If in decision block 110, a decision is made that the system is operating in startup mode, or if the system temperature is above or equal to its lower temperature threshold ($T_t \geq T_{l2}$) then processing proceeds to decision block 114. If in decision block 114 a decision is made that the number of other heaters in their on state, $N_h$, is less than the total number of available heaters which are authorized to be on, $N_p$, processing proceeds to processing blocks 116, 118 and the heater can turn on following a delay.

If in decision block 114 a decision is made that the number of other heaters in their on state, $N_h$, is greater than the total number of available heaters which are authorized to be on, $N_p$, processing proceeds to processing block 120 and the heater remains off.

If in decision block 110, a decision is made that the heater is operating in its normal mode and the temperature being controlled (e.g. a room temperature) has dropped below a second, lower threshold temperature ($T_{l2}$) such that $T_t < T_{l2}$ then processing proceeds to decision block 112.

The use of a lower temperature threshold $T_{l2}$ allows the heater to autonomously "shed load," prioritizing limiting the aggregate heater power demand, until the system temperature drops to a minimum level (e.g. in the case of a heater heating a space, the minimum level corresponds to a minimum comfort level of an occupant in the space). At that point, the heater prioritizes thermal comfort and will turn on the heater so long as doing does not risk exceeding the total available generation capacity of the power sources (e.g. the total available generation capacity of power sources 40 in FIG. 21) In embodiments, the maximum number of heaters which are authorized to be on, $N_{max}$, is selected based upon the number of available power sources and their total capacity.

Importantly, prior to turning its heater on, the autonomous load controller enacts a delay, with the length of the delay dependent upon the system temperature error ($T_e$), which may be computed as:

$$T_e = T_t - T_s, \quad (19)$$

where:

$T_t$ is the system temperature; and $T_s$ is the target temperature setpoint for the system.

This time-dependent delay is may be determined as shown in equation (20):

$$t_d = \begin{cases} t_o + mT_e, & \text{if } T_e < \frac{t_{min} - t_o}{m} \\ t_{min}, & \text{otherwise} \end{cases} \quad (20)$$

Here, $t_o$, $m$, and $t_{min}$ are positive values representing the offset and slope of the delay's relationship with temperature error in its linear region, and an optionally set minimum temperature delay, respectively.

Figure 24:
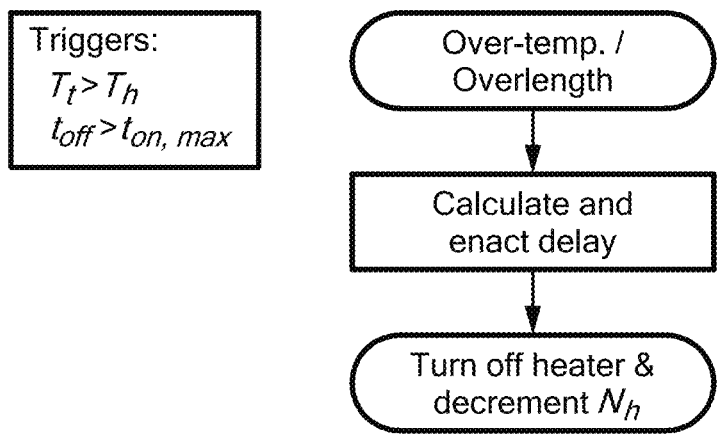
FIG. 24 is a flow diagram of an over-temperature/over-length process for a heater having a state diagram as shown in FIG. 22.

The over-temperature/overlength process as shown in FIG. 24 (which may be, for example, an ISR) enacts control similar to thermostatic control in response to the system temperature eclipsing a high temperature threshold level, though the routine also imparts an error-dependent time-delay, $$t_d = \begin{cases} t_o + mT_e, & \text{if } T_e < \frac{t_{min} - t_o}{m} \\ t_{min}, & \text{otherwise} \end{cases} \quad (21)$$

It should be appreciated that the purpose of the delay timer in both of these temperature-based routines (i.e. in FIGS. 23 and 24) is to allow the heater most in need to take action first.

One final note regarding the over-temperature/overlength ISR is that it is also triggered if the time that a heater is on, $t_{on}$ exceeds a maximum threshold, $t_{on,max}$. This rule enforces resource sharing among the autonomous loads. Similar to the delay-times, the maximum on-time can be made dependent on temperature error to promote increased resource sharing allocation to the tents that most require heat.

Figure 25:
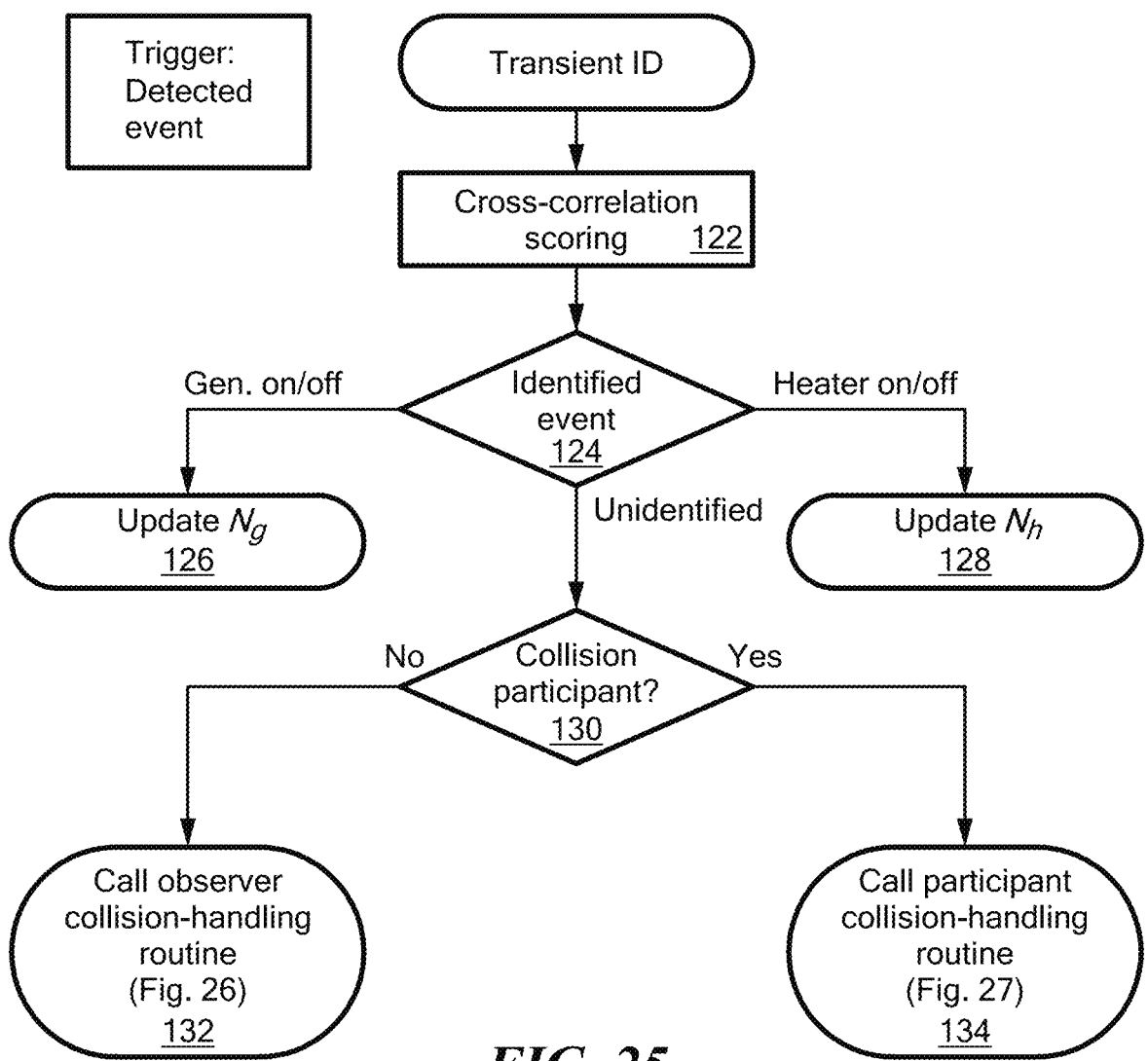
FIG. 25 is a flow diagram of an illustrative transient identification process for a heater having a state diagram as shown in FIG. 22.

Referring now to FIG. 25, a transient identification routine is triggered when an event is detected in either or both of the frequency or 7th harmonic data streams. If an event is identified as a power source or heater on/off event 124 according to its cross-correlation scores 122, the routine updates the heater autonomous load controller's knowledge of the microgrid state accordingly (126, 128). When the heater does not recognize the event, it is either because the event was caused by one or more unmonitored loads, or because a heater or a power source changed states at nearly the same as did another heater, power source or unmonitored load. This situation may be referred to as an "event collision" 130. To address (and ideally rectify) such an ambiguity, each heater may calls one of two collision-handling routines 132, 134, depending upon if it participated in the collision (i.e. it changed states at the time of the unidentified event) or just observed it. Two example routines are described below in conjunction with FIGS. 26 and 27.

Figure 26:
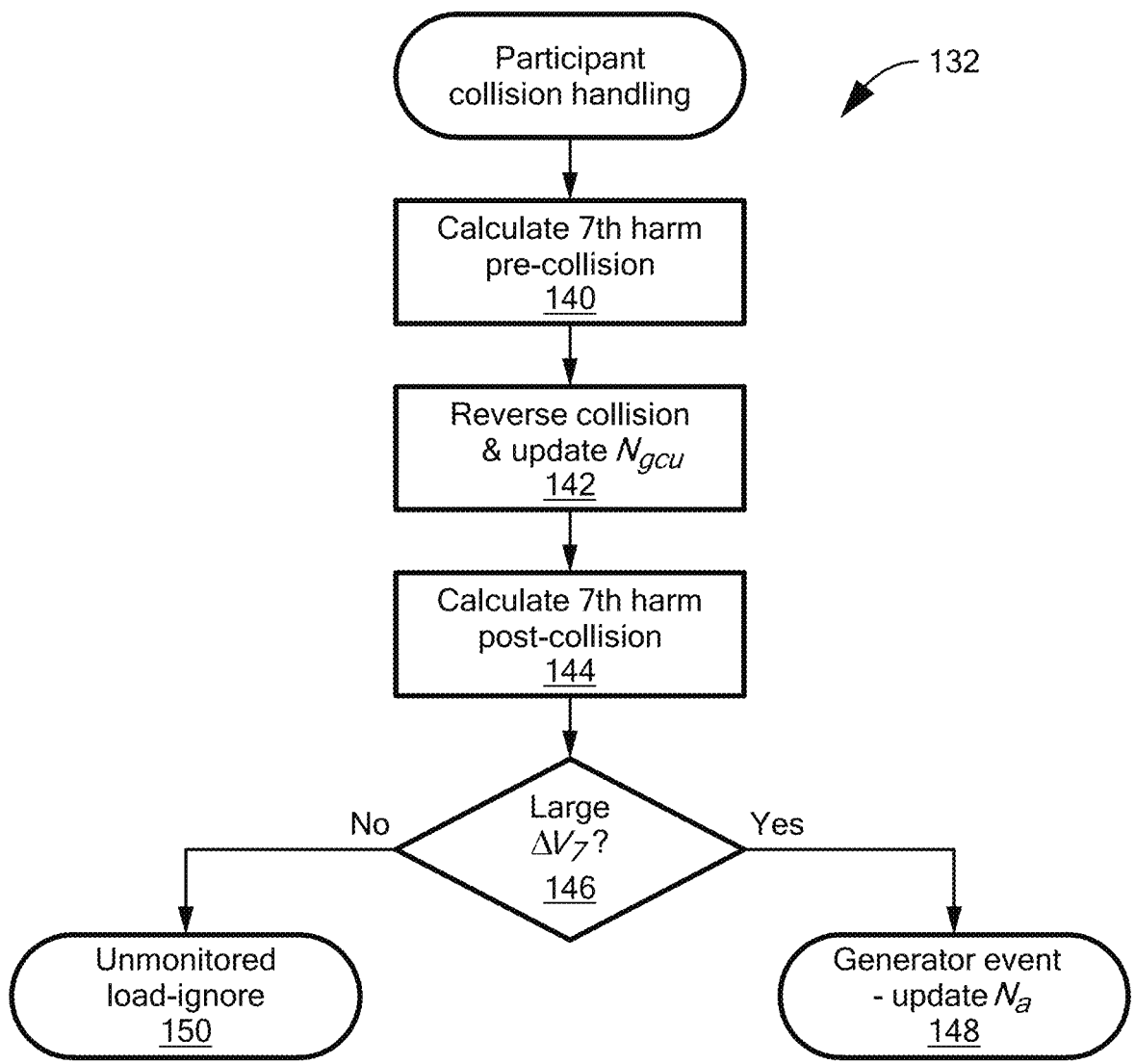
FIG. 26 is a flow diagram of an illustrative collision-handling process for a heater having a state diagram as shown in FIG. 22.
Figure 27:
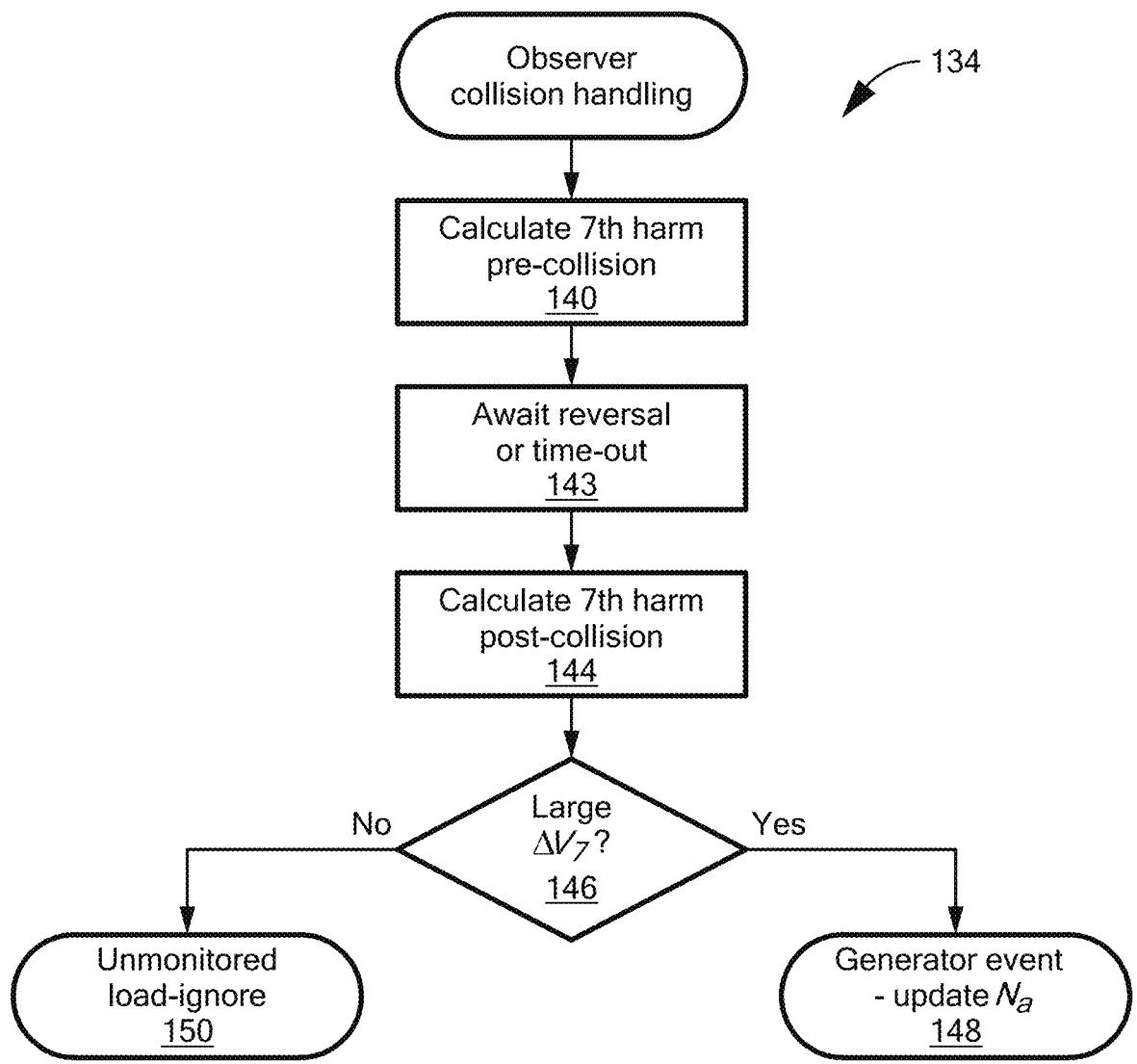
FIG. 27 is a flow diagram of an illustrative collision-handling process for a heater having a state diagram as shown in FIG. 22.

The function of the illustrative collision-handling routines shown in FIGS. 26 and 27 is to reverse all controllable actions which contributed to the collision, and to determine whether any uncontrolled events of interest (power source turn-on or turn-off events, in this case) also contributed.

Referring now to FIG. 26, for a participant in the collision, processing begins as shown in processing block 140 by the participant logging the average value of their 7th harmonic streams for a period of time (e.g. one second) preceding the unidentified transient. The period of time may be preselected, or adapted or selected in the field based on how often transient events typically occur, and therefore establishing a likely time when the indicator, seventh harmonic in this example embodiment, is free of transient activity from the loads that caused the collision.

Following this, processing proceeds to processing block 142 in which collision participants reverse their actions (e.g. heaters that turned on, turn back off) and update their $N_h$ counts to comply with the reversal. Significantly, this action also restores the accuracy of the other autonomous heaters as they will not have recognized the collision event. Once this reversal concludes (assessed by observes either by witnessing the reversal or after a set length of time), processing proceeds to processing block 144 in which each heater in the collision measures (via the transient identification processor) the 7th harmonic stream again for comparison with pre-collision levels.

Because any heaters involved in the collision have reversed their actions, there is no difference in the number of heaters operating during these two measurements, and only uncontrolled loads or power source events will have caused differences in the 7th harmonic measurements.

As discussed, in embodiments, the effect of power source events on the 7th harmonic may be larger (and in some cases, significantly larger) than those of uncontrolled events, and thus as shown in decision block 146, the autonomous load controller determines power source event participation based upon the size of the difference between the pre-transient and post-transient 7th harmonic measurements. Processing then proceeds to either processing block 148 (generator event) 150 (unmonitored load) based upon the size of the difference between the pre-transient and post-transient 7th harmonic measurements.

Referring now to FIG. 27, for an observer of the collision, processing begins as shown in processing block 140 by the participant logging the average value of their 7th harmonic streams for a period of time (e.g. one second) preceding the unidentified transient.

Processing then proceeds to processing block 143 in which collision observers await confirmation that collision participants have reversed their actions (e.g. heaters that turned on, turn back off) or collision observers simply wait a predetermined period of time. Once the reversal concludes (assessed by observes either by witnessing the reversal or after a set length of time), processing proceeds to processing block 144 in which each heater measures (via the transient identification processor) the 7th harmonic stream again for comparison with pre-collision levels.

As above explain above in conjunction with the processing of FIG. 26, because any heaters involved in the collision have reversed their actions, there is no difference in the number of heaters operating during these two measurements, and only uncontrolled loads or power source events will have caused differences in the 7th harmonic measurements.

As also discussed above, in embodiments, the effect of power source events on the 7th harmonic may be larger (and in some cases, significantly larger) than those of uncontrolled events, and thus as shown in decision block 146, the autonomous load controller determines power source event participation based upon the size of the difference between the pre-transient and post-transient 7th harmonic measurements and processing proceeds to either processing block 148 (generator event) 150 (unmonitored load) based upon the size of the difference between the pre-transient and post-transient 7th harmonic measurements.

It should be understood that various embodiments of the concepts disclosed herein are described with reference to the related drawings. Alternative embodiments can be devised without departing from the scope of the broad concepts described herein. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to disposing a layer or element "A" over a layer or element "B" include situations in which one or more intermediate layers or elements (e.g., layer or element "C") is between layer/element "A" and layer/element "B" as long as the relevant characteristics and functionalities of layer/element "A" and layer/element "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance, or illustration." Any embodiment or design described herein as "exemplary" is not necessarily to be construed as preferred or advantageous over other embodiments or designs. The terms "one or more" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection".

References in the specification to "one embodiment," "an embodiment," "an example embodiment," etc., indicate that the embodiment described can include a particular feature, structure, or characteristic, but every embodiment can include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description provided herein, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, where intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

One skilled in the art will realize the concepts, structures, devices, and techniques described herein may be embodied in other specific forms without departing from the spirit or essential concepts or characteristics thereof. The foregoing embodiments are therefore to be considered in all respects illustrative rather than limiting of the broad concepts sought to be protected. The scope of the concepts is thus indicated by the appended claims, rather than by the foregoing description, and all changes that come within the meaning and range of equivalency of the claims are therefore intended to be embraced therein.

What is claimed is:

1. An autonomous load having an input, the autonomous load comprising:
  a voltage detection circuit coupled to measure one or more voltage signals at the input of the autonomous load;
  an event identification processor coupled to the voltage detection circuit to receive one or more voltage signals measured by the voltage detection circuit and to extracting and identify a load event corresponding to at least one characteristic of at least one of the one or more measured voltage signals, the event identification processor comprising:
    a transient identification processor coupled to receive one or more voltage signals from the voltage detection circuit and to extract frequency and voltage harmonic transients from the one or more voltage signals and to identify individual load events corresponding to the extracted frequency and voltage harmonic transients; and
  an autonomous load controller coupled to the event identification processor, the autonomous load controller configured to receive load event information from the transient identification processor and in response to the load event information provided thereto, provide a control signal to the autonomous load.

2. The autonomous load of claim 1 wherein the autonomous load controller monitors an environment of the autonomous load.

3. The autonomous load of claim 1 wherein the autonomous load controller updates knowledge of a grid state and/or a load state.

4. The autonomous load of claim 1 wherein the autonomous load controller causes a load to change states.

5. The autonomous load of claim 1 wherein the autonomous load controller receives information on an operational state of a load and on external factors of the load and processes internal factors such as the operational state of the load and external factor information in determining whether to cause a load to change states.

6. The autonomous load of claim 3 wherein in response to the event identification processor identifying an event as a power source on/off event or load on/off event, the event identification processor updates the autonomous load controller's knowledge of the grid state by updating a memory in the autonomous load controller.

7. The autonomous load of claim 1 wherein the transient identification processor is configured to extract frequency and voltage harmonic transients as a data stream and in response to an event being detected in either or both of a frequency data stream or a 7th harmonic data stream, a transient identification process takes place to identify an event.

8. The autonomous load of claim 1 wherein if the transient identification processor does not recognize an event, the transient identification processor declares an event collision.

9. The autonomous load of claim 1 wherein the transient identification processor is configured to identify a $7^{th}$ frequency harmonic characteristic.

10. A method for controlling an autonomous load, the method comprising:
    detecting a voltage signal at an input of the autonomous load;
    extracting frequency and voltage harmonic transients from the detected voltage signal;
    identifying an individual load event corresponding to the extracted frequency and voltage harmonic transients; and
    in response to the identified individual load event, providing one or more control signals to the autonomous load.

11. The method of claim 10 further comprising monitoring an environment of the autonomous load.

12. The method of claim 10 further comprising updating autonomous load knowledge of a grid state and/or a load state of the autonomous load.

13. The method of claim 10 further comprising causing the autonomous load to change states.

14. The method of claim 10 further comprising:
    receiving information on an operational state of a load and on external factors of the load; and
    processing the operational state information and external factors in determining whether to cause the autonomous load to change states.

15. The method of claim 10 further comprising performing a transient identification process in response to detection of an event in either or both of a frequency or a 7th harmonic data streams.

16. The method of claim 12 wherein in response to a transient identification process identifying an event as a power source on/off event or load on/off event, updating the autonomous load's knowledge of the grid state.

17. A system comprising:
    an electrical power grid;
    a bank of power sources coupled to the electrical power grid; and
    one or more autonomous loads coupled to the electrical power grid, each of the one or more autonomous loads configured to draw power from the electrical power grid and each of the one or more autonomous loads comprising:
    a voltage detection circuit configured to measure voltage values at an input to a load; and
    a transient identification processor configured to receive the measured voltage values from the voltage detection circuit and configured to process the measured voltage values to identify frequency variations and harmonics in the measured voltage values to identify a transient and to compare the transient to an exemplar.

18. The system of claim 17 wherein the bank of power sources comprises a plurality of generators.

19. The system of claim 17 wherein the power sources are provided as one or more of fuel operated generators, solar generators and wind power turbines.

20. The system of claim 17 wherein the electrical power grid corresponds to a microgrid.

21. The system of claim 17 further comprising an autonomous load controller having an input adapted to be coupled to a load, wherein the autonomous load controller monitors an environment of the load.

22. The system of claim 17 further comprising an autonomous load controller having an input adapted to be coupled to a load, wherein the autonomous load controller updates knowledge of a grid state and/or a load state of the load.

23. The system of claim 17 further comprising an autonomous load controller having an input adapted to be coupled to a load, wherein the autonomous load controller causes the load to change states.

24. The system of claim 17 further comprising an autonomous load controller having an input adapted to be coupled to a load, wherein the autonomous load controller receives information on an operational state of the load and on external factors of the load and processes the operational state and external factor information in determining whether to cause the load to change states.

25. The system of claim 17 wherein a transient identification routine is triggered in response to an event being detected in either or both of a frequency data stream or a harmonic data stream.

26. The system of claim 25 wherein the harmonic data stream is a 7th harmonic data stream.

27. The system of claim 22 wherein in response to the transient identification processor identifying an event as a power source on/off event or load on/off event, the transient identification processor updates the autonomous load controller's knowledge of the grid state.

28. The system of claim 17 wherein if the transient identification processor does not recognize an event, the transient identification processor declares an event collision.

* * * * *